United States Patent
Tanada et al.

(10) Patent No.: US 8,779,348 B2
(45) Date of Patent: Jul. 15, 2014

(54) SEMICONDUCTOR DEVICE COMPRISING PHOTODIODE AND TRANSISTOR CIRCUIT

(75) Inventors: Yoshifumi Tanada, Kanagawa (JP); Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 516 days.

(21) Appl. No.: 12/407,108

(22) Filed: Mar. 19, 2009

(65) Prior Publication Data

US 2009/0236496 A1    Sep. 24, 2009

(30) Foreign Application Priority Data

Mar. 21, 2008    (JP) .................................. 2008-072811

(51) Int. Cl.
*H01L 31/00*    (2006.01)

(52) U.S. Cl.
USPC ....................................................... 250/214.1

(58) Field of Classification Search
USPC ............. 250/214 A, 214 LA, 214 C, 214 DC, 250/214 R, 214.1, 551; 363/126, 127; 327/514; 356/221–226; 330/59, 308
See application file for complete search history.

(56) References Cited

U.S. PATENT DOCUMENTS

| | | | | |
|---|---|---|---|---|
| 3,450,888 | A * | 6/1969 | Spangler | 250/548 |
| 4,639,134 | A * | 1/1987 | Bletz | 356/223 |
| 4,959,797 | A * | 9/1990 | McIntosh | 700/275 |
| 5,216,274 | A | 6/1993 | Mihara | |
| 5,389,776 | A * | 2/1995 | Woodward | 250/214 LS |
| 5,952,887 | A * | 9/1999 | Katayanagi et al. | 330/308 |
| 7,605,358 | B2 * | 10/2009 | Suzuki et al. | 250/214 R |
| 2002/0006694 | A1 * | 1/2002 | Kawahara | 438/186 |
| 2003/0132369 | A1 * | 7/2003 | Aswell et al. | 250/214.1 |

FOREIGN PATENT DOCUMENTS

| | | |
|---|---|---|
| JP | 62-060275 | 3/1987 |
| JP | 05-067765 A | 3/1993 |
| JP | 6-029567 | 2/1994 |
| JP | 06-335162 | 12/1994 |
| JP | 2001-332567 | 11/2001 |
| JP | 2004-187168 | 7/2004 |

* cited by examiner

*Primary Examiner* — Thanh Luu
*Assistant Examiner* — Renee Naphas
(74) *Attorney, Agent, or Firm* — Nixon Peabody LLP; Jeffrey L. Costellia

(57) ABSTRACT

Objects are to suppress reduction in current output from a photoelectric conversion device and to prevent ESD from occurring in the photoelectric conversion device without greatly increasing the number of steps for manufacturing the photoelectric conversion device. The photoelectric conversion device includes a photodiode generating current by light irradiation; an amplifier circuit including at least one MOS transistor for amplifying the current; and at least one diode which is connected in series with the photodiode in a path of the current generated in the photodiode or a path of the current amplified by at least one MOS transistor so that a bias direction of the diode is opposite to that of the photodiode. Each of the photodiode and the diode includes a stack of a plurality of semiconductor films.

8 Claims, 18 Drawing Sheets

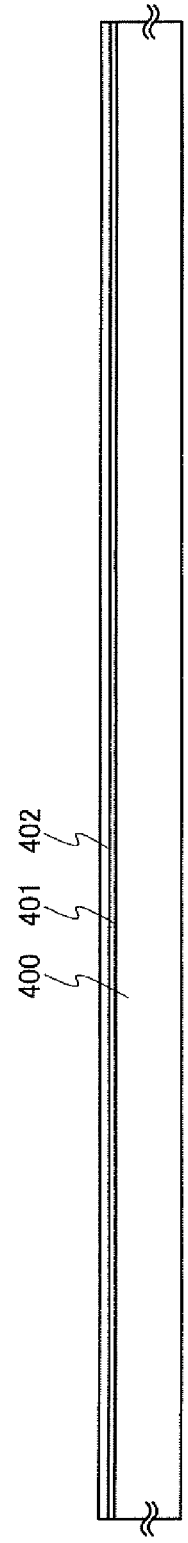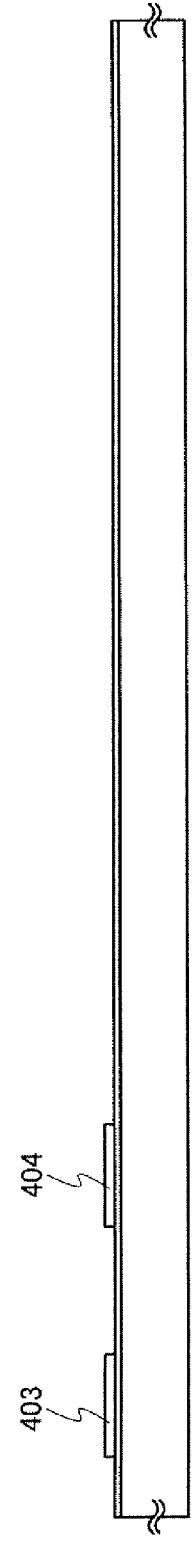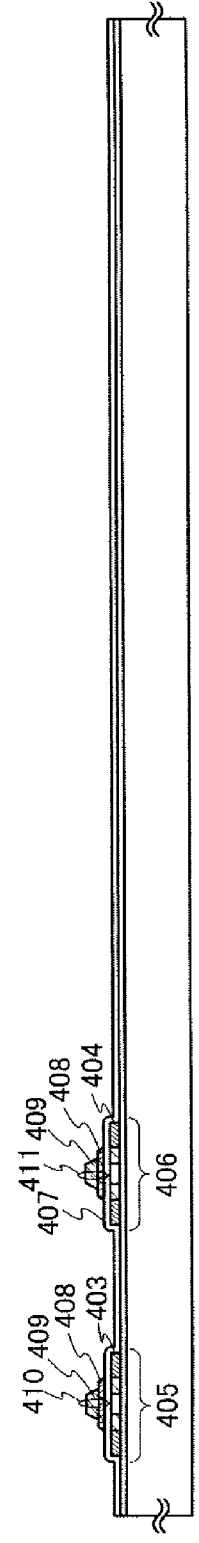

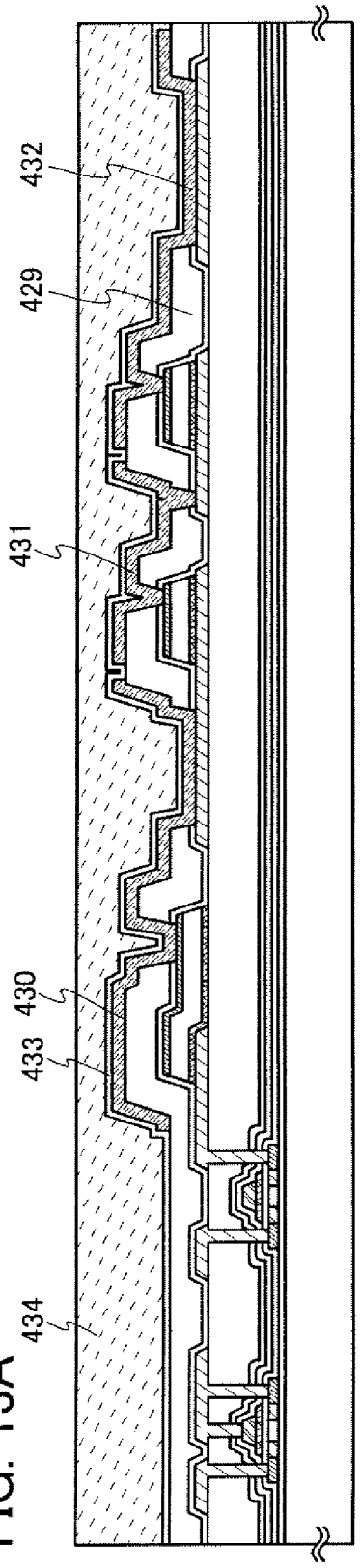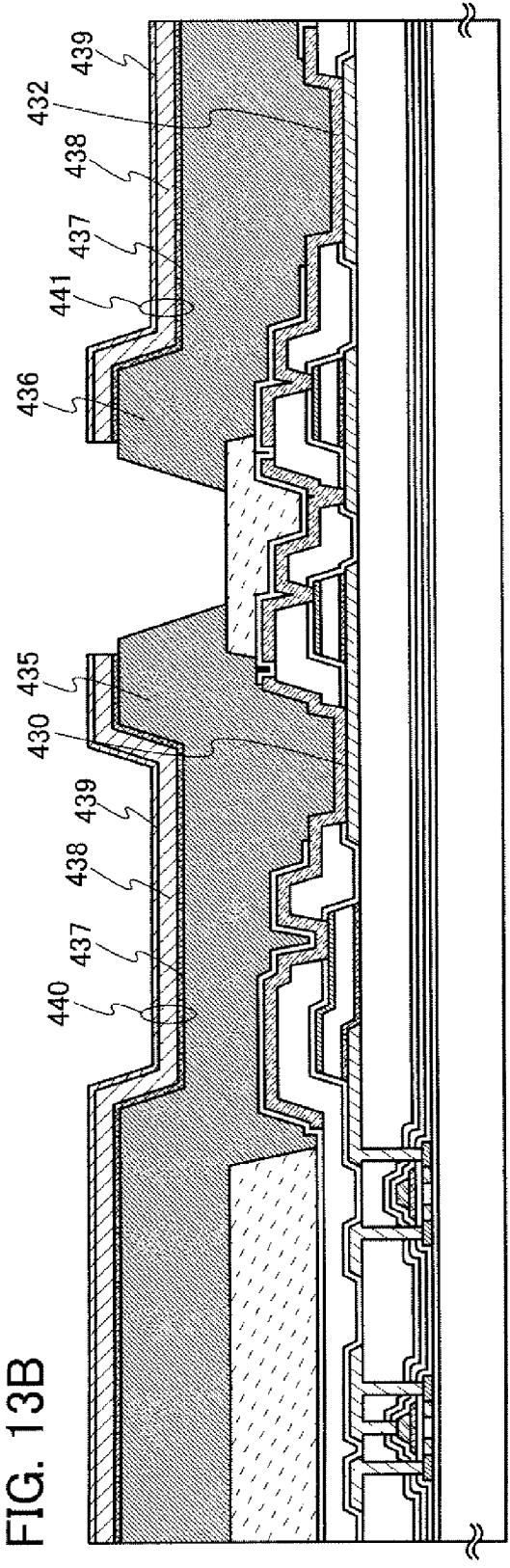
FIG. 13A
FIG. 13B

SEMICONDUCTOR DEVICE COMPRISING PHOTODIODE AND TRANSISTOR CIRCUIT

BACKGROUND OF THE INVENTION

1. Field of the Invention

The present invention relates to a photoelectric conversion device including a photodiode and an integrated circuit.

2. Description of the Related Art

Light-receiving elements used as optical sensors are roughly divided into three categories: a light-receiving element using photovoltaic effect, a light-receiving element using photoconductive effect, and a light-receiving element using photoemission effect. Among these light-receiving elements, the light-receiving element using photovoltaic effect, such as a photodiode and a phototransistor, has high response speed and low power consumption and can be easily miniaturized. The light-receiving element using photovoltaic effect can be applied to a wide range of applications such as optical communication, optical fiber, remote controllers, light pens, fax machines, illuminometers, color sensors, linear image sensors, spectrophotometers, and exposure meters.

A phototransistor generates current when a junction of semiconductors is irradiated with light. A photodiode generates current when a junction of semiconductors is irradiated with light. A phototransistor is more sensitive to light than a photodiode. On the other hand, although a photodiode has higher response time than a phototransistor, current obtained when the photodiode receives light is very small. Therefore, the photodiode is generally used in combination with an amplifier circuit which amplifies the current. An element in which a transistor included in an integrated circuit such as an amplifier circuit, a constant voltage circuit, or a Schmitt trigger circuit and a photodiode are formed on one chip is referred to as a photo IC (a photoelectric conversion device).

Patent Document 1 (Japanese Published Patent Application No. H6-029567) discloses a light-receiving circuit in which a photodiode and a thin film transistor are formed on one substrate.

SUMMARY OF THE INVENTION

In order to prevent a phenomenon (ESD: electro-static discharge) where a transistor used in an integrated circuit is deteriorated or damaged by surge current due to discharge of charges stored by charging, it is necessary to determine causes and circumstances of charging and to devise the structure of the integrated circuit so that resistance against deterioration or dielectric breakdown due to surge current is increased. The provision of a discharge path using a diode or a resistor is effective in preventing deterioration or dielectric breakdown due to surge current.

However, a transistor often substitutes for a diode used in a protective circuit in order not to increase the number of steps for manufacturing a photo IC. In that case, the transistor has poor resistance to static electricity and thus is less effective in preventing ESD. Moreover, when resistors are connected in series in a current path so as to prevent damage to a transistor included in an integrated circuit due to overcurrent, voltage drop is caused by the resistors even if the photo IC is normally operated. Accordingly, current output from the photo IC is reduced when a photodiode is irradiated with light.

In view of the foregoing problems, objects of the present invention are to suppress reduction in current output from a photo IC and to prevent ESD from occurring in the photo IC without greatly increasing the number of steps for manufacturing the photo IC.

The inventors have focused attention on the fact that diodes, especially a vertical-junction type PN diode in which a semiconductor film having p-type conductivity and a semiconductor film having n-type conductivity are stacked; and a vertical-junction type PIN diode in which a semiconductor film having p-type conductivity, a semiconductor film having i-type conductivity, and a semiconductor film having n-type conductivity are stacked, are less likely to be deteriorated or damaged by dielectric breakdown due to surge current than thin film transistors. They have considered that the occurrence of ESD in a photo IC can be effectively prevented by adding a vertical-junction type diode for ESD prevention to the photo IC so that the diode is connected in series or parallel with a vertical-junction type photodiode used as a light-receiving element.

A vertical-junction type diode can have a larger junction surface than a diode formed using a transistor Accordingly, the vertical-junction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor Moreover, the thickness of semiconductor films in the vertical-junction type diode can be thicker than a semiconductor film and a gate insulating film included in the transistor, whereby deterioration or dielectric breakdown by surge current can be prevented.

When a diode for SED prevention is connected in series with a photodiode serving as a light-receiving element, it is preferable that the diode for ESD prevention be not provided with a light-shielding film for preventing incidence of light so that current generated in the light-receiving element is not blocked, and that an anode and a cathode of the diode for ESD prevention be set so that the polarity of voltage generated between the anode and the cathode is opposite to that of the photodiode serving as the light-receiving element.

In addition, when first current which is generated by the photodiode serving as the light-receiving element is supplied to an integrated circuit and the integrated circuit generates second current by using the first current, a diode for ESD prevention can be connected in parallel with the photodiode in a path of the second current. Note that it is preferable that the diode for ESD prevention be not provided with a light-shielding film for preventing incidence of light so that current generated in the light-receiving element is not blocked, and that the anode and the cathode of the diode for ESD prevention be set so that the polarity of voltage generated between the anode and the cathode is opposite to that of the photodiode serving as the light-receiving element.

Further, when first current which is generated by the photodiode serving as the light-receiving element is supplied to the integrated circuit and the integrated circuit generates second current by using the first current, a diode for ESD prevention can be connected in parallel with the photodiode in a path different from a path of the second current. In that case, the anode and the cathode of the diode for ESD prevention are set so that the polarity of voltage generated between the anode and the cathode is the same as that of the photodiode serving as the light-receiving element. Note that it is preferable that the diode for ESD prevention be provided with a light-shielding film for preventing incidence of light in order to prevent current from flowing through the diode for ESD prevention when a photo IC is normally operated.

Moreover, when first current which is generated by the photodiode serving as the light-receiving element is supplied to the integrated circuit and the integrated circuit generates second current by using the first current, a plurality of diodes for ESD prevention which are connected in series can be connected in parallel with the photodiode in a path different from a path of the second current. In that case, the anode and the cathode of the plurality of diodes for ESD prevention are set so that the polarity of voltage generated between the anode and the cathode is opposite to that of the photodiode serving as the light-receiving element. Note that it is preferable that the plurality of diodes for ESD prevention be provided with a light-shielding film for preventing incidence of light in order to prevent current from flowing through the plurality of diodes for ESD prevention when a photo IC is normally operated.

In the present invention, a vertical-junction type photodiode may be used as a diode for ESD prevention. By using the vertical-junction type photodiode as the diode for ESD prevention, the photodiode for ESD prevention can be formed together with a light-receiving element without increasing the number of steps.

According to the present invention, reduction in current output from a photo IC can be suppressed and the occurrence of ESD in the photo IC can be prevented without greatly increasing the number of steps for manufacturing the photo IC.

BRIEF DESCRIPTION OF THE DRAWINGS

In the accompanying drawings:
FIGS. 11A to 11C illustrate a method for manufacturing a photo IC;
FIGS. 13A and 13B illustrate a method for manufacturing a photo IC.

DETAILED DESCRIPTION OF THE INVENTION

Hereinafter, embodiment modes of the present invention will be described with reference to the drawings. Note that the present invention can be implemented in various modes, and it is easily understood by those skilled in the art that modes and details can be variously changed without departing from the spirit and scope of the present invention. Therefore, the present invention is not construed as being limited to the description of the embodiment modes.

Embodiment Mode 1

Figure 1:
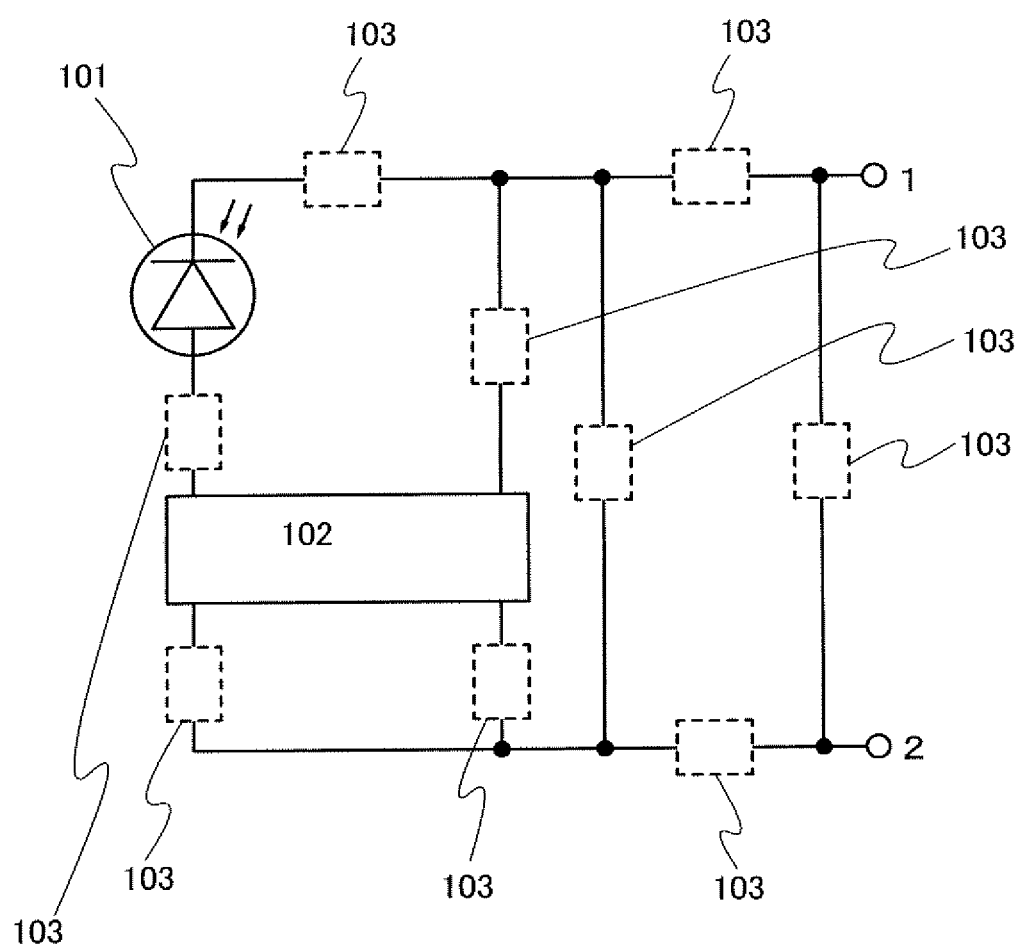
FIG. 1 illustrates a structure of a photo IC.

A structure of a photo IC of the present invention will be described with reference to FIG. 1. FIG. 1 is an example of a circuit diagram illustrating a structure of a photo IC of the present invention. The photo IC illustrated in FIG. 1 includes a light-receiving element 101 including a photodiode, an integrated circuit 102 to which current that is generated in the light-receiving element 101 when the light-receiving element 101 is irradiated with light is supplied, and at least one protective diode 103 including a diode, preferably a photodiode. FIG. 1 illustrates the circuit diagram of the photo IC in which the protective diodes 103 are provided at a plurality of positions; however, at least one protective diode 103 is provided at any position.

The integrated circuit 102 includes at least one transistor and can perform processing, for example, amplify current generated in the light-receiving element 101 and convert current generated in the light-receiving element 101 into voltage.

Moreover, the photo IC has at least two terminals: a first terminal 1 and a second terminal 2. In the photo IC of the present invention, in a current path or a voltage path which connects the first terminal 1 and the second terminal 2, the protective diode 103 may be connected in series with the light-receiving element 101 or the integrated circuit 102 or may be connected in parallel with the light-receiving element 101 and the integrated circuit 102.

An anode and a cathode of the protective diode 103 are preferably set so that current or voltage that is generated between the first terminal and the second terminal 2 when the light-receiving element 101 is irradiated with light is prevented from being reduced by the protective diode 103 or current can be prevented from flowing between the first terminal 1 and the second terminal 2 through the protective diode 103 when the light-receiving element 101 is not irradiated with light. Specifically, the anode and the cathode of the protective diode 103 are set in consideration of the connection relation between the light-receiving, element 101 and the protective diode 103.

Figure 2:
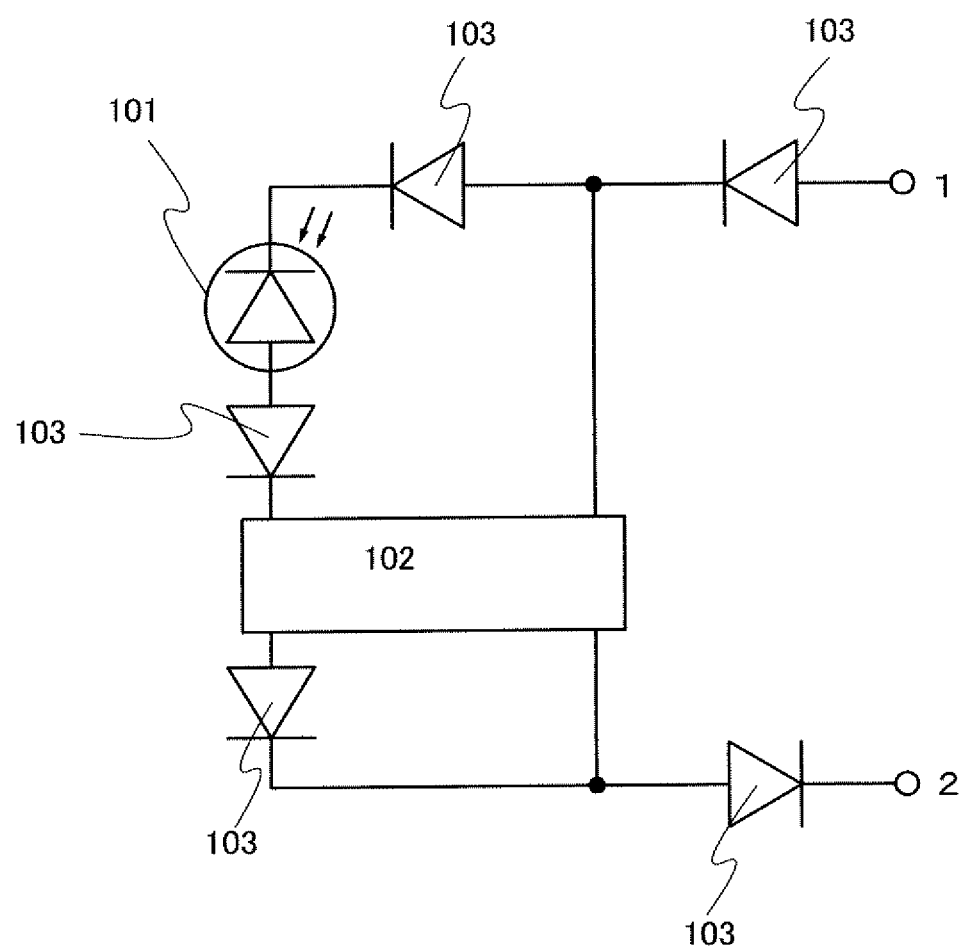
FIG. 2 illustrates a structure of a photo IC.

FIG. 2 illustrates an example of a circuit diagram of a photo IC in the case where the light-receiving element 101 and the protective diode 103 are connected in series in a path connecting the first terminal 1 and the second terminal 2. FIG. 2 illustrates the circuit diagram of the photo IC in which the protective diodes 103 are provided at a plurality of positions; however, at least one protective diode 103 is provided at any position. Moreover, the photo IC illustrated in FIG. 2 has a path where only the integrated circuit 102 of the light-receiving element 101 and the integrated circuit 102 is provided between the first terminal 1 and the second terminal 2 in addition to a path where the light-receiving element 101 and the integrated circuit 102 are provided between the first terminal 1 and the second terminal 2. A photo IC is not necessarily provided with the former path depending on the structure of the integrated circuit 102.

Specifically, in FIG. 2, in the path where the light-receiving element 101 and the integrated circuit 102 are provided between the first terminal 1 and the second terminal 2, the protective diode 103 can be provided between the first terminal 1 and the light-receiving element 101, between the light-receiving element 101 and the integrated circuit 102, and between the integrated circuit 102 and the second terminal 2. The anode and the cathode of each protective diode 103 illustrated in FIG. 2 are set so that the bias direction of the protective diode 103 is opposite to that of the light-receiving element 101, in other words, the polarity of voltage generated between the anode and the cathode is opposite to that of the light-receiving element 101. With the above structure, a resistance value of the protective diode 103 in the forward-bias direction is reduced when the protective diode 103 is irradiated with light. Accordingly, current or voltage that is generated between the first terminal 1 and the second terminal 2 when the light-receiving element 101 is irradiated with light can be prevented from being reduced by the protective diode 103.

Figure 3:
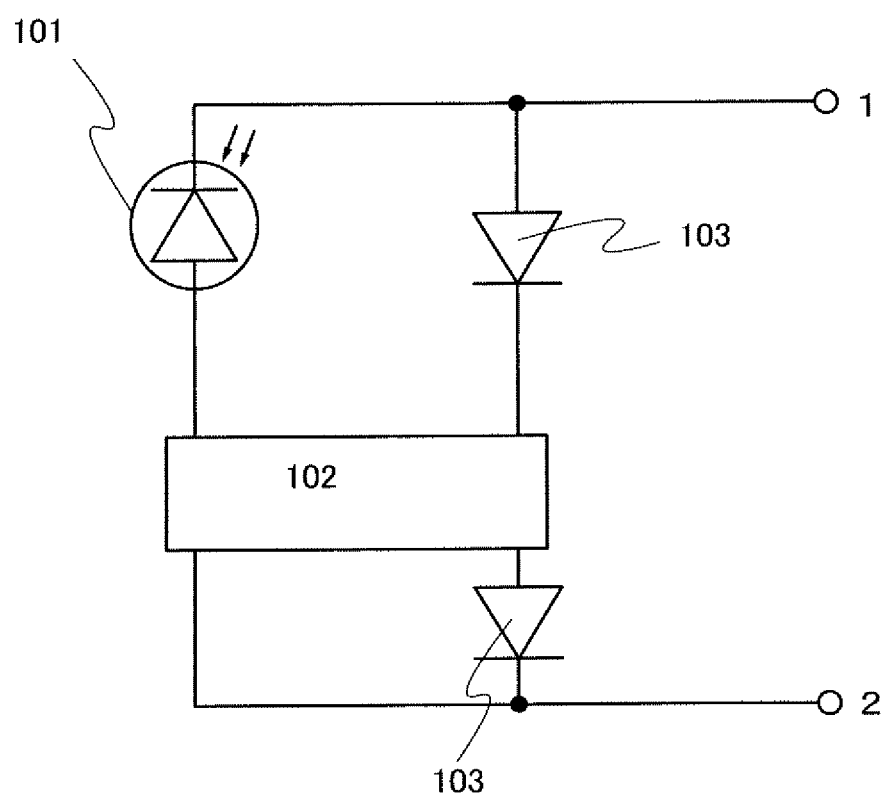
FIG. 3 illustrates a structure of a photo IC.

Next, FIG. 3 illustrates an example of a circuit diagram of a photo IC in the case where the protective diode 103 is connected in series with the light-receiving element 101 in a path where only the integrated circuit 102 of the light-receiving element 101 and the integrated circuit 102 is provided between the first terminal 1 and the second terminal 2. FIG. 3 illustrates the circuit diagram of the photo IC in which the protective diodes 103 are provided at a plurality of positions; however, at least one protective diode 103 is provided at any position.

Specifically, in FIG. 3, in the path where only the integrated circuit 102 of the light-receiving element 101 and the integrated circuit 102 is provided between the first terminal 1 and the second terminal 2, the protective diode 103 can be provided between the first terminal 1 and the integrated circuit 102 and between the integrated circuit 102 and the second terminal 2. The anode and the cathode of each protective diode 103 illustrated in FIG. 3 are set so that the bias direction of the protective diode 103 is opposite to that of the light-receiving element 101, in other words, the polarity of voltage generated between the anode and the cathode is opposite to that of the light-receiving element 101. With the above structure, a resistance value of the protective diode 103 in the forward-bias direction is reduced when the protective diode 103 is irradiated with light. Note that when current is generated in the light-receiving element 101 by light irradiation, current or voltage which is commensurate with the current is generated in the path where only the integrated circuit 102 of the light-receiving element 101 and the integrated circuit 102 is provided between the first terminal 1 and the second terminal 2. Accordingly, reduction in resistance value of the protective diode 103 in the forward-bias direction can prevent current or voltage that is generated between the first terminal 1 and the second terminal 2 when the light-receiving element 101 is irradiated with light from being reduced by the protective diode 103.

Figure 4:
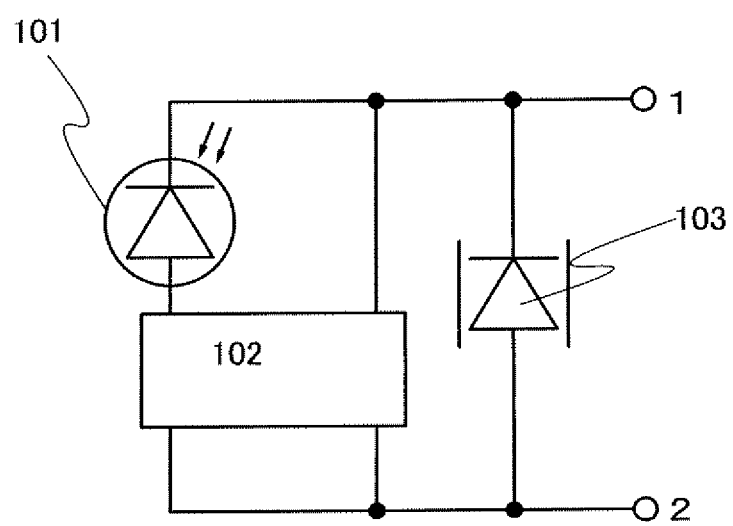
FIG. 4 illustrates a structure of a photo IC.

Next, FIG. 4 illustrates an example of a circuit diagram of a photo IC in the case where the protective diode 103 is connected in parallel with the light-receiving element 101 and the integrated circuit 102 in a path connecting the first terminal 1 and the second terminal 2. FIG. 4 illustrates the circuit diagram of the photo IC in which only one protective diode 103 is provided; however, the number of the protective diodes 103 is not limited to one and at least one protective diode 103 may be provided. Moreover, the photo IC illustrated in FIG. 4 has a path where only the integrated circuit 102 of the light-receiving element 101 and the integrated circuit 102 is provided between the first terminal 1 and the second terminal 2 in addition to a path where the light-receiving element 101 and the integrated circuit 102 are provided between the first terminal 1 and the second terminal 2. A photo IC is not necessarily provided with the former path depending on the structure of the integrated circuit 102.

Specifically, the anode and the cathode of the protective diode 103 illustrated in FIG. 4 are set so that the bias direction of the protective diode 103 is the same as that of the light-receiving element 101, in other words, the polarity of voltage generated between the anode and the cathode is the same as that of the light-receiving element 101. Further, the protective diode 103 is provided with a light-shielding film which prevents light from entering the protective diode 103 even when the light-receiving element 101 is irradiated with the light. Since light is prevented from entering the protective diode 103, a resistance value of the protective diode 103 in the forward-bias direction remains high even when the light-receiving element 101 is irradiated with the light; accordingly, current can be prevented from flowing between the first terminal 1 and the second terminal 2 through the protective diode 103.

Figure 5:
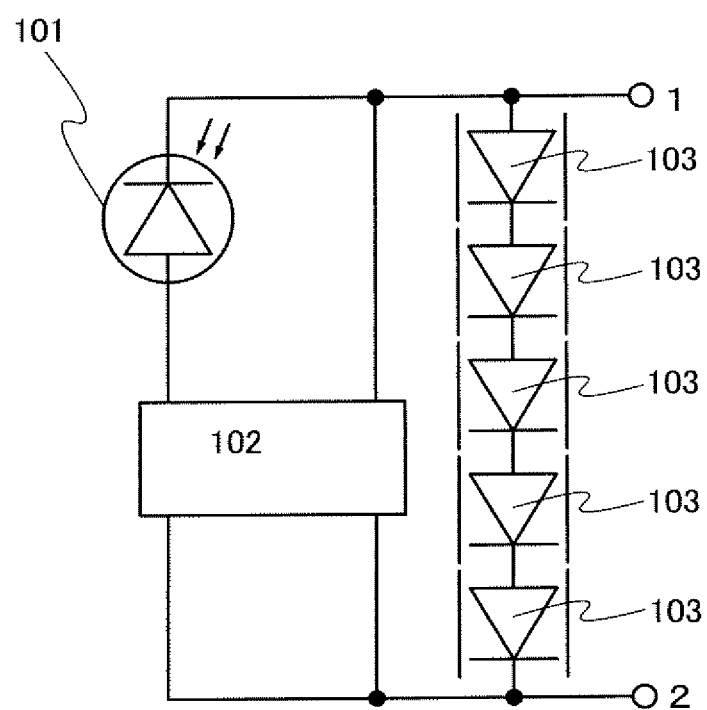
FIG. 5 illustrates a structure of a photo IC.

Next, FIG. 5 illustrates an example of a circuit diagram of a photo IC in the case where a plurality of protective diodes 103 are connected in parallel with the light-receiving element 101 and the integrated circuit 102 in a path connecting the first terminal 1 and the second terminal 2. FIG. 5 illustrates the circuit diagram of the photo IC in which five protective diodes 103 are provided; however, there is no particular limitation on the number of the protective diodes 103 and a plurality of protective diodes 103 may be provided. Note that the photo IC illustrated in FIG. 5 has a path where only the integrated circuit 102 of the light-receiving element 101 and the integrated circuit 102 is provided between the first terminal 1 and the second terminal 2 in addition to a path where the light-receiving element 101 and the integrated circuit 102 are provided between the first terminal 1 and the second terminal 2. A photo IC is not necessarily provided with the former path depending on the structure of the integrated circuit 102.

Specifically, the anode and the cathode of each of the plurality of protective diodes 103 illustrated in FIG. 5 are set so that the bias direction of the protective diode 103 is opposite to that of the light-receiving element 101, in other words, the polarity of voltage generated between the anode and the cathode is opposite to that of the light-receiving element 101. Further, each of the plurality of protective diodes 103 is provided with a light-shielding film which prevents light from entering the protective diode 103 even when the light-receiving element 101 is irradiated with the light. Moreover, the plurality of protective diodes 103 are all connected in series between the first terminal 1 and the second terminal 2. With the above structure, voltage which is applied to each of the plurality of protective diodes 103 when the photo IC is normally operated is reduced; accordingly, current can be prevented from flowing between the first terminal 1 and the second terminal 2 through the plurality of protective diodes 103.

Note that in this embodiment mode, FIG. 2, FIG. 3, FIG. 4, and FIG. 5 illustrate modes of the photo ICs in which the positions of the protective diode 103 and the directions of the anode and the cathode of the protective diode 103 are different from each other. Alternatively, any of a plurality of modes illustrated in FIG. 2, FIG. 3, FIG. 4, and FIG. 5 can be implemented in combination.

In the photo IC of the present invention, a vertical-junction type diode, preferably a vertical-junction type photodiode, is used as the protective diode 103 as in the light-receiving element 101. Accordingly, increase in the number of steps for manufacturing the photo IC can be prevented even when the protective diode 103 is additionally provided. Further, a vertical-junction type diode can have a larger junction surface than a diode formed using a transistor. Accordingly, the vertical-unction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor. Moreover, the thickness of semiconductor films in the vertical-junction type diode can be thicker than a seminconductor film and a gate insulating film included in the transistor, whereby deterioration or dielectric breakdown by surge current can be prevented.

Embodiment Mode 2

In this embodiment mode, a structure of a photo IC in which the modes illustrated in FIG. 3 and FIG. 4 are combined will be described.

Figure 6:
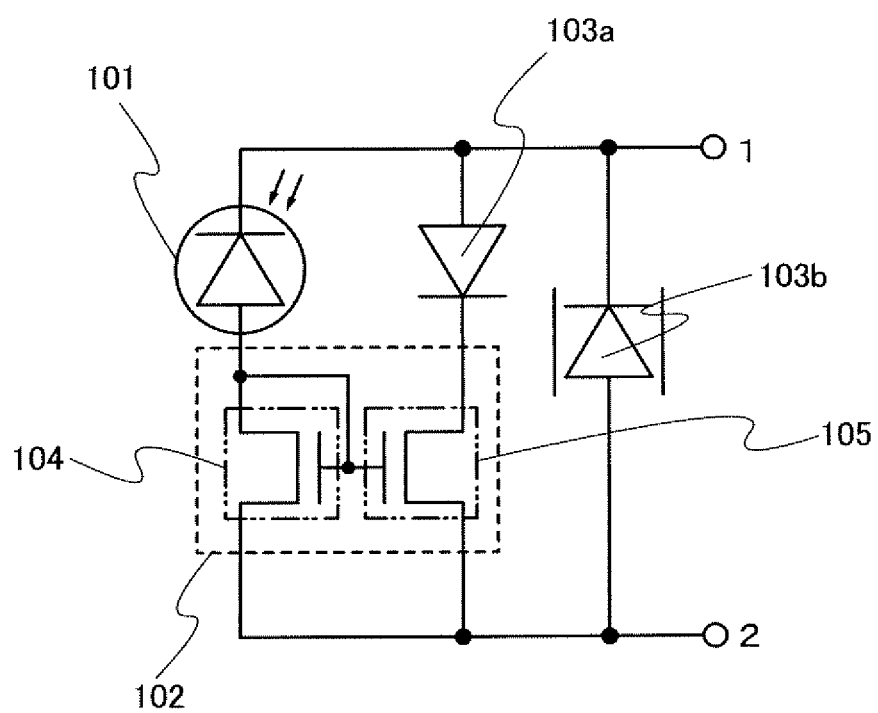
FIG. 6 is a circuit diagram illustrating a structure of a photo IC.

A photo IC illustrated in FIG. 6 includes the light-receiving element 101 including a photodiode the integrated circuit 102 to which current that is generated in the light-receiving element 101 when the light-receiving element 101 is irradiated with light is supplied, at least one protective diode 103a including a diode or a photodiode, and at least one protective diode 103b including a diode or a photodiode.

Note that FIG. 6 illustrates an amplifier circuit which uses a current mirror including a transistor 104 and a transistor 105 as an example of the integrated circuit 102. The amplifier circuit can amplify current generated in the light-receiving element 101. Specifically, a gate of the transistor 104 and a gate of the transistor 105 are connected to each other. One of a source and a drain of the transistor 104 is connected to the gate of the transistor 104. Moreover, the transistor 104 is connected in series with the light-receiving element 101 between the first terminal 1 and the second terminal 2. The transistor 105 is connected in parallel with the light-receiving element 101 between the first terminal 1 and the second terminal 2.

In the above amplifier circuit, when current generated in the light-receiving element 101 due to light irradiation flows between the source and the drain of the transistor 104, current is also generated between a source and a drain of the transistor 105. The current generated between the source and the drain of the transistor 105 can be controlled by the ratio of channel width to channel length of the transistor 104 and the ratio of channel width to channel length of the transistor 105. It is preferable to control the current generated between the source and the drain of the transistor 105 by the ratio of channel width of the transistor 104 to channel width of the transistor 105 because the control can be performed more accurately.

The photo IC illustrated in FIG. 6 has at least two terminals: the first terminal 1 and the second terminal 2. In a path where only the integrated circuit 102 of the light-receiving element 101 and the integrated circuit 102 is provided between the first terminal 1 and the second terminal 2 among current paths or voltage paths which connect the first terminal 1 and the second terminal 2, the protective diode 103a is connected in parallel with the light-receiving element 101. Specifically, the protective diode 103a is connected in parallel with the light-receiving element 101 between the first terminal 1 and the transistor 105. Alternatively, the protective diode 103a may be connected in parallel with the light-receiving element 101 between the second terminal 2 and the transistor 105. Note that FIG. 6 illustrates the case where only one protective diode 103a is provided; however, the number of the protective diodes 103a is not limited to one and at least one protective diode 103a may be provided.

An anode and a cathode of the protective diode 103a are set so that the bias direction of the protective diode 103a is opposite to that of the light-receiving element 101, in other words, the polarity of voltage generated between the anode and the cathode is opposite to that of the light-receiving element 101. With the above structure, a resistance value of the protective diode 103a in the forward-bias direction is reduced when the protective diode 103a is irradiated with light. Accordingly, current flowing between the source and the drain of the transistor 105 can be prevented from being reduced by the protective diode 103a; thus, current generated between the first terminal 1 and the second terminal 2 can be prevented from being reduced.

Moreover, in the path connecting the first terminal 1 and the second terminal 2, the protective diode 103b is connected in parallel with the light-receiving element 101 and the integrated circuit 102. FIG. 6 illustrates the case where only one protective diode 103b is provided; however, the number of the protective diodes 103b is not limited to one and at least one protective diode 103b may be provided.

An anode and a cathode of the protective diode 103b are set so that the bias direction of the protective diode 103b is the same as that of the light-receiving element 101, in other words, the polarity of voltage generated between the anode and the cathode is the same as that of the light-receiving element 101. Further, the protective diode 103b is provided with a light-shielding film which prevents light from entering the protective diode 103b even when the light-receiving element 101 is irradiated with the light. Since light is prevented from entering the protective diode 103b, a resistance value of the protective diode 103b in the forward-bias direction remains high even when the light-receiving element 101 is irradiated with the light; accordingly, current can be prevented from flowing between the first terminal 1 and the second terminal 2 through the protective diode 103b.

Note that in the photo IC illustrated in FIG. 6, the protective diode 103b is directly connected between the first terminal 1 and the second terminal 2; however, the present invention is not limited to this structure. A resistor, a diode-connected transistor, or the like may be connected in series with the protective diode 103b between the protective diode 103b and the first terminal 1 or between the protective diode 103b and the second terminal 2. The above structure can more effectively prevent the integrated circuit 102 from being damaged by surge current. Note that a diode-connected transistor corresponds to a transistor whose gate is connected to one of its source and drain.

In the photo IC of the present invention, a vertical-junction type photodiode can be used as the protective diodes 103a and 103b as in the light-receiving element 101. Accordingly, increase in the number of steps for manufacturing the photo IC can be prevented even when the protective diodes 103a and 103b are additionally provided. Further, a vertical-junction type diode can have a larger junction surface than a diode formed using a transistor. Accordingly, the vertical-junction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor. Moreover, the thickness of semiconductor films in the vertical-junction type diode can be thicker than a semiconductor film and a gate insulating film included in the transistor, whereby deterioration or dielectric breakdown by surge current can be prevented.

The photo IC illustrated in FIG. 6, in which the protective diodes 103a and 103b are used in combination, can more effectively prevent the light-receiving element 101, the integrated circuit 102, and the protective diodes 103a and 103b from being damaged by surge current, than a photo IC in which the protective diode 103a or the protective diode 103b is used by itself.

This embodiment mode can be implemented in combination with other embodiment modes and embodiments as appropriate.

Embodiment Mode 3

In this embodiment mode, a structure of a photo IC in which the modes illustrated in FIG. 2 and FIG. 3 are combined will be described.

Figure 7:
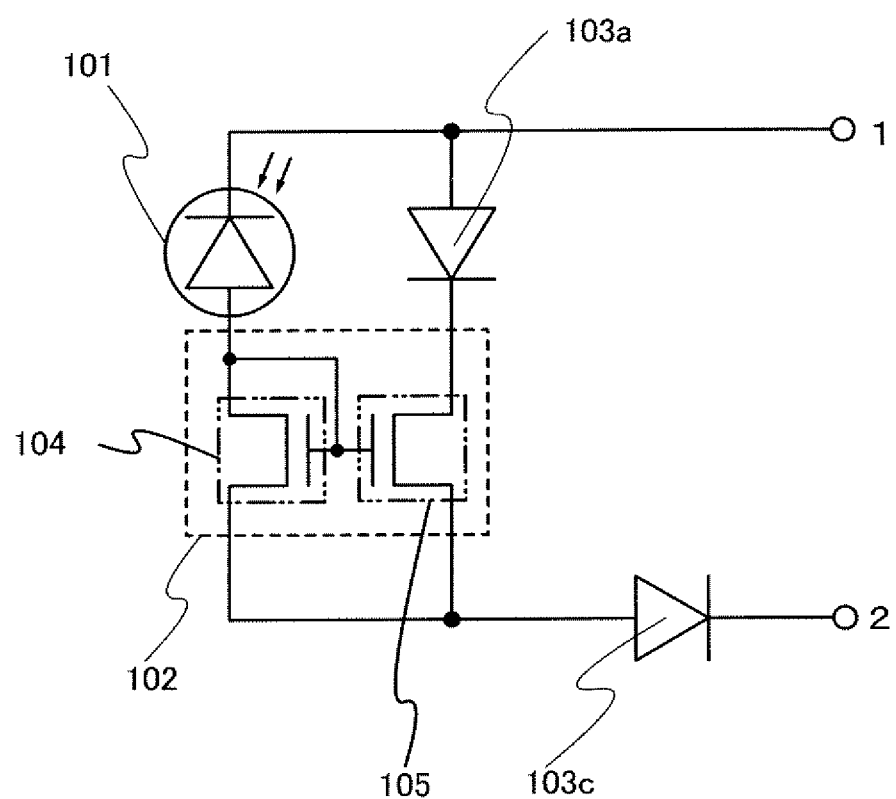
FIG. 7 is a circuit diagram illustrating a structure of a photo IC.

A photo IC illustrated in FIG. 7 includes the light-receiving element 101 including a photodiode, the integrated circuit 102 to which current that is generated in the light-receiving element 101 when the light-receiving element 101 is irradiated with light is supplied, at least one protective diode 103a including a diode or a photodiode, and at least one protective diode 103c including a diode or a photodiode.

Note that FIG. 7 illustrates an amplifier circuit which uses a current mirror including the transistors 104 and 105 as an example of the integrated circuit 102.

The photo IC illustrated in FIG. 7 has at least two terminals: the first terminal 1 and the second terminal 2. In a path where only the integrated circuit 102 of the light-receiving element 101 and the integrated circuit 102 is provided between the first terminal 1 and the second terminal 2 among current paths or voltage paths which connect the first terminal 1 and the second terminal 2, the protective diode 103a is connected in parallel with the light-receiving element 101. Specifically, the protective diode 103a is connected in parallel with the light-receiving element 101 between the first terminal 1 and the transistor 105. Alternatively, the protective diode 103a may be connected in parallel with the light-receiving element 101 between the second terminal 2 and the transistor 105. Note that FIG. 7 illustrates the case where only one protective diode 103a is provided; however, the number of the protective diodes 103a is not limited to one and at least one protective diode 103a may be provided.

The anode and the cathode of the protective diode 103a are set so that the bias direction of the protective diode 103a is opposite to that of the light-receiving element 101, in other words, the polarity of voltage generated between the anode and the cathode is opposite to that of the light-receiving element 101. With the above structure, a resistance value of the protective diode 103a in the forward-bias direction is reduced when the protective diode 103a is irradiated with light. Accordingly, current flowing between the source and the drain of the transistor 105 can be prevented from being reduced by the protective diode 103a; thus, current generated between the first terminal 1 and the second terminal 2 can be prevented from being reduced.

Moreover, in the path connecting the first terminal 1 and the second terminal 2, the protective diode 103c is connected in series with the light-receiving element 101. Specifically, in FIG. 7, the protective diode 103c is connected between the transistor 105 and the second terminal 2. Alternatively, the protective diode 103c may be connected between the transistor 104 and the second terminal 2, between the light-receiving element 101 and the transistor 104, between the light-receiving element 101 and the first terminal 1, or between the transistor 105 and the first terminal 1. Note that FIG. 7 illustrates the case where only one protective diode 103c is provided; however, the number of the protective diodes 103c is not limited to one and at least one protective diode 103c may be provided.

An anode and a cathode of the protective diode 103c are set so that the bias direction of the protective diode 103c is opposite to that of the light-receiving element 101, in other words, the polarity of voltage generated between the anode and the cathode is opposite to that of the light-receiving element 101. With the above structure, a resistance value of the protective diode 103c in the forward-bias direction is reduced when the protective diode 103c is irradiated with light. Accordingly, current flowing between the source and the drain of the transistor 104 can be prevented from being reduced by the protective diode 103c; thus, current generated between the first terminal 1 and the second terminal 2 can be prevented from being reduced.

In the photo IC of the present invention, a vertical-junction type diode, preferably a vertical-junction type photodiode, is used as the protective diodes 103a and 103c as in the light-receiving element 101. By using the vertical-junction type photodiode, increase in the number of steps for manufacturing the photo IC can be prevented even when the protective diodes 103a and 103c are additionally provided. Further, a vertical-junction type diode can have a larger junction surface than a diode formed using a transistor. Accordingly, the vertical-junction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor. Moreover, the thickness of semiconductor films in the vertical-junction type diode can be thicker than a semiconductor film and a gate insulating film included in the transistor, whereby deterioration or dielectric breakdown by surge current can be prevented.

The photo IC illustrated in FIG. 7, in which the protective diodes 103a and 103c are used in combination, can more effectively prevent the light-receiving element 101, the integrated circuit 102, and the protective diodes 103a and 103c from being damaged by surge current, than a photo IC in which the protective diode 103a or the protective diode 103c is used by itself.

This embodiment mode can be implemented in combination with other embodiment modes and embodiments as appropriate.

Embodiment Mode 4

In this embodiment mode, a structure of a photo IC in which the modes illustrated in FIG. 2 and FIG. 3 are combined will be described.

Figure 8:
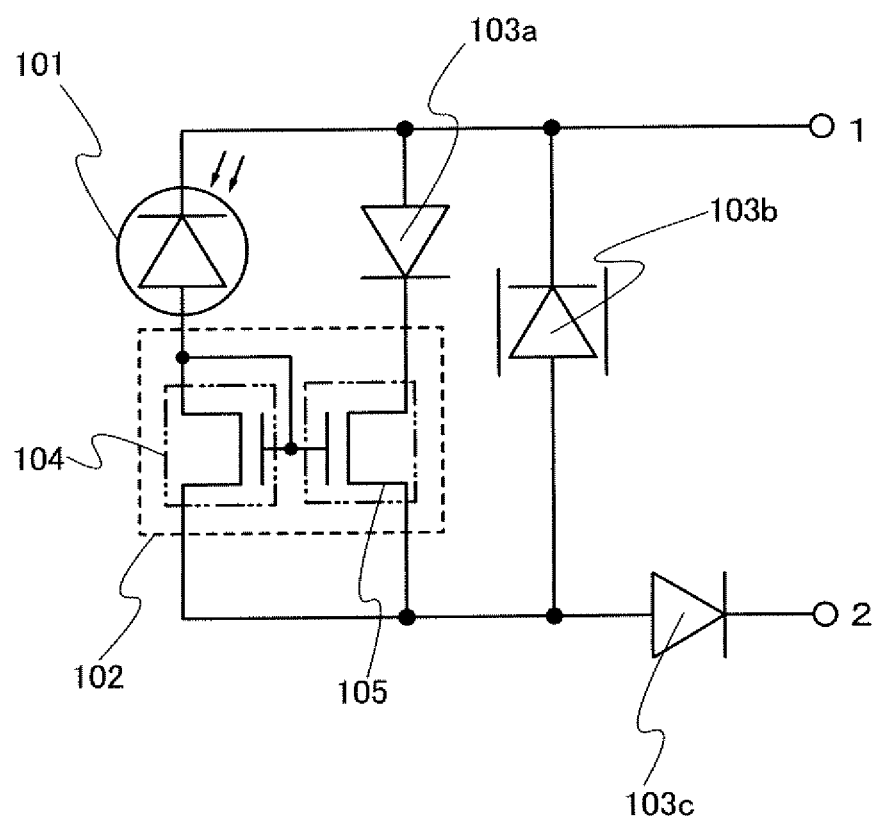
FIG. 8 is a circuit diagram illustrating a structure of a photo IC.

A photo IC illustrated in FIG. 8 includes the light-receiving element 101 including a photodiode, the integrated circuit 102 to which current that is generated in the light-receiving element 101 when the light-receiving element 101 is irradiated with light is supplied, at least one protective diode 103a including a diode or a photodiode, at least one protective diode 103b including a diode or a photodiode, and at least one protective diode 103c including a photodiode.

Note that FIG. 8 illustrates an amplifier circuit which uses a current mirror including the transistors 104 and 105 as an example of the integrated circuit 102.

The photo IC illustrated in FIG. 8 has at least two terminals: the first terminal 1 and the second terminal 2. In a path where only the integrated circuit 102 of the light-receiving element 101 and the integrated circuit 102 is provided between the first terminal 1 and the second terminal 2 among current paths or voltage paths which connect the first terminal 1 and the second terminal 2, the protective diode 103a is connected in parallel with the light-receiving element 101. Specifically, the protective diode 103a is connected in parallel with the light-receiving element 101 between the first terminal 1 and the transistor 105. Alternatively, the protective diode 103a may be connected in parallel with the light-receiving element 101 between the second terminal 2 and the transistor 105. Note that FIG. 8 illustrates the case where only one protective diode 103*a* is provided; however, the number of the protective diodes 103*a* is not limited to one and at least one protective diode 103*a* may be provided.

The anode and the cathode of the protective diode 103*a* are set so that the bias direction of the protective diode 103*a* is opposite to that of the light-receiving element 101, in other words, the polarity of voltage generated between the anode and the cathode is opposite to that of the light-receiving element 101. With the above structure, a resistance value of the protective diode 103*a* in the forward-bias direction is reduced when the protective diode 103*a* is irradiated with light. Accordingly, current flowing between the source and the drain of the transistor 105 can be prevented from being reduced by the protective diode 103*a*; thus, current generated between the first terminal 1 and the second terminal 2 can be prevented from being reduced.

Moreover, in the path connecting the first terminal 1 and the second terminal 2, the protective diode 103*b* is connected in parallel with the light-receiving element 101 and the integrated circuit 102. FIG. 8 illustrates the case where only one protective diode 103*b* is provided; however, the number of the protective diodes 103*b* is not limited to one and at least one protective diode 103*b* may be provided.

The anode and the cathode of the protective diode 103*b* are set so that the bias direction of the protective diode 103*b* is the same as that of the light-receiving element 101, in other words, the polarity of voltage generated between the anode and the cathode is the same as that of the light-receiving element 101. Further, the protective diode 103*b* is provided with a light-shielding film which prevents light from entering the protective diode 103*b* even when the light-receiving element 101 is irradiated with the light. Since light is prevented from entering the protective diode 103*b*, a resistance value of the protective diode 103*b* in the forward-bias direction remains high even when the light-receiving element 101 is irradiated with the light; accordingly, current can be prevented from flowing between the first terminal 1 and the second terminal 2 through the protective diode 103*b*.

Moreover, in the path connecting the first terminal 1 and the second terminal 2, the protective diode 103*c* is connected in series with the light-receiving element 101. Specifically, in FIG. 8, the protective diode 103*c* is connected between the transistor 105 and the second terminal 2. Alternatively, the protective diode 103*c* may be connected between the transistor 104 and the second terminal 2, between the light-receiving element 101 and the transistor 104, between the light-receiving element 101 and the first terminal 1, or between the transistor 105 and the first terminal 1. Note that FIG. 8 illustrates the case where only one protective diode 103*c* is provided; however, the number of the protective diodes 103*c* is not limited to one and at least one protective diode 103*c* may be provided.

The anode and the cathode of the protective diode 103*c* are set so that the bias direction of the protective diode 103*c* is opposite to that of the light-receiving element 101, in other words, the polarity of voltage generated between the anode and the cathode is opposite to that of the light-receiving element 101. With the above structure, a resistance value of the protective diode 103*c* in the forward-bias direction is reduced when the protective diode 103*c* is irradiated with light. Accordingly, current flowing between the source and the drain of the transistor 104 can be prevented from being reduced by the protective diode 103*c*; thus, current generated between the first terminal 1 and the second terminal 2 can be prevented from being reduced.

In the photo IC of the present invention, a vertical-junction type diode, preferably a vertical-junction type photodiode, is used as the protective diodes 103*a*, 103*b*, and 103*c* as in the light-receiving element 101. By using the vertical-junction type photodiode as the protective diodes 103*a*, 103*b*, and 103*c*, increase in the number of steps for manufacturing the photo IC can be prevented even when the protective diodes 103*a*, 103*b*, and 103*c* are additionally provided. Further, a vertical-junction type diode can have a larger junction surface than a diode formed using a transistor. Accordingly, the vertical-junction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor. Moreover, the thickness of semiconductor films in the vertical-junction type diode can be thicker than a semiconductor film and a gate insulating film included in the transistor, whereby deterioration or dielectric breakdown by surge current can be prevented.

The photo IC illustrated in FIG. 8, in which the protective diodes 103*a*, 103*b*, and 103*c* are used in combination, can more effectively prevent the light-receiving element 101, the integrated circuit 102, and the protective diodes 103*a*, 103*b*, and 103*c* from being damaged by surge current, than a photo IC in which the protective diode 103*a*, the protective diode 103*b*, or the protective diode 103*c* is used by itself or a photo IC in which any two of the protective diodes 103*a*, 103*b*, and 103*c* are used in combination.

This embodiment mode can be implemented in combination with other embodiment modes and embodiments as appropriate.

Embodiment Mode 5

In this embodiment mode, a specific structure of a photo IC of the present invention, in which an amplifier circuit is used as an integrated circuit, will be described.

Figure 9:
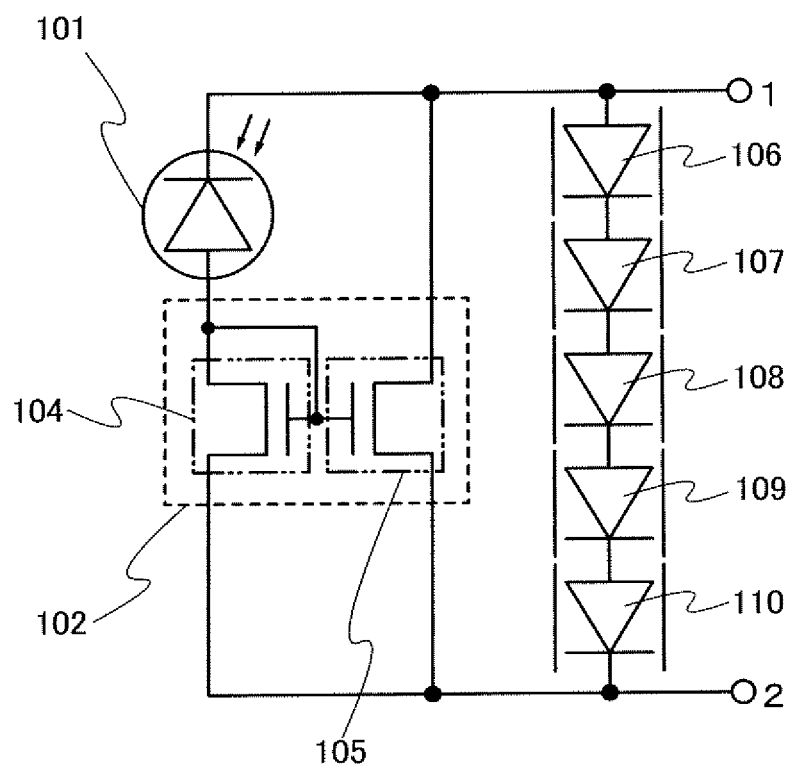
FIG. 9 is a circuit diagram illustrating a structure of a photo IC.
Figure 10:
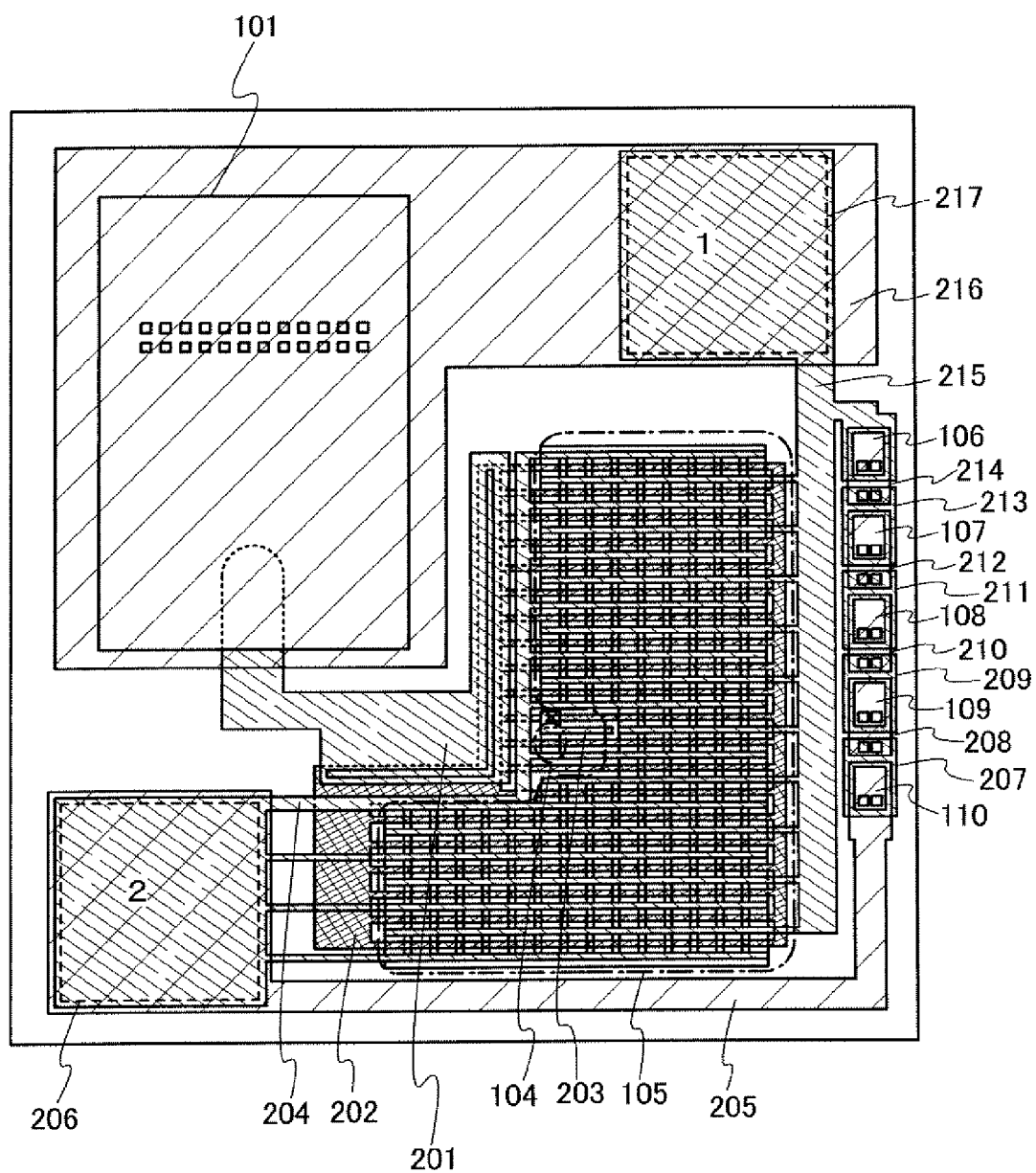
FIG. 10 is a top view of a photo IC.

FIG. 9 is a circuit diagram of a photo IC in this embodiment mode. FIG. 10 illustrates an example of a top view of the photo IC illustrated in FIG. 9.

In a path connecting the first terminal 1 and the second terminal 2, protective diodes 106 to 110 are connected in parallel with the light-receiving element 101 and the integrated circuit 102. Note that FIG. 9 and FIG. 10 illustrate the case where five protective diodes 106 to 110 are provided; however, there is no particular limitation on the number of the protective diodes and a plurality of protective diodes may be provided. Further, FIGS. 9 and 10 illustrate an amplifier circuit which uses a current mirror including the transistors 104 and 105 as an example of the integrated circuit 102.

An anode and a cathode of each of the protective diodes 106 to 110 illustrated in FIG. 9 and FIG. 10 are set so that the bias direction of the protective diode is opposite to that of the light-receiving element 101, in other words, the polarity of voltage generated between the anode and the cathode is opposite to that of the light-receiving element 101. The protective diodes 106 to 110 are all connected in series between the first terminal 1 and the second terminal 2. Further, the protective diodes 106 to 110 are each provided with a light-shielding film which prevents light from entering each of the protective diodes 106 to 110 even when the light-receiving element 101 is irradiated with the light.

With the above structure, voltage which is applied to each of the protective diodes 106 to 110 when the photo IC is normally operated is reduced; accordingly, current can be prevented from flowing between the first terminal 1 and the second terminal 2 through the protective diodes 106 to 110.

In addition, as illustrated in FIG. 10, in the photo IC of the present invention, a vertical-junction type diode in which semiconductor films are stacked, preferably a vertical-junction type photodiode, is used as the light-receiving element 101 and the protective diodes 106 to 110.

Specifically, the anode of the light-receiving element 101 is connected to a conductive film 201. The conductive film 201 is connected to a conductive film 202. Part of the conductive film 202 functions as the gate of the transistor 104 and the gate of the transistor 105. Moreover, the conductive film 202 is connected to a conductive film 203. The conductive film 203 is connected to one of the source and the drain of the transistor 104. A conductive film 204 is connected to the other of the source and the drain of the transistor 104 and one of the source and the drain of the transistor 105.

Further, the conductive film 204 is connected to a conductive film 205. The conductive film 205 is connected to the second terminal 2 in a region 206. Moreover, the conductive film 205 is connected to the cathode of the protective diode 110. The anode of the protective diode 110 is connected to a conductive film 207. The conductive film 207 is connected to a conductive film 208. The conductive film 208 is connected to the cathode of the protective diode 109. The anode of the protective diode 109 is connected to a conductive film 209. The conductive film 209 is connected to a conductive film 210. The conductive film 210 is connected to the cathode of the protective diode 108. The anode of the protective diode 108 is connected to a conductive film 211. The conductive film 211 is connected to a conductive film 212. The conductive film 212 is connected to the cathode of the protective diode 107. The anode of the protective diode 107 is connected to a conductive film 213. The conductive film 213 is connected to a conductive film 214. The conductive film 214 is connected to the cathode of the protective diode 106. The anode of the protective diode 106 is connected to a conductive film 215.

In this embodiment mode, the conductive film 207 connected to the anode of the protective diode 110 is formed so as to overlap with the anode and functions as a light-shielding film for preventing light from entering the anode of the protective diode 110. Similarly, the conductive film 209 functions as a light-shielding film of the protective diode 109; the conductive film 211 as a light-shielding film of the protective diode 108; the conductive film 213 as a light-shielding film of the protective diode 107; and the conductive film 215 as a light-shielding film of the protective diode 106.

Note that in this embodiment mode, the anode side of the protective diodes 106 to 110 is shielded from light; however, the present invention is not limited to this structure. The protective diode may be provided with a light-shielding film for blocking light which enters the protective diode from at least one of the anode side and the cathode side. Further, in this embodiment mode, the conductive film for electrically connecting elements or terminals is used as a light-shielding film; however, the present invention is not limited to this structure. A light-shielding film which is different from the conductive film for electrically connecting elements or terminals may be additionally formed.

The conductive film 215 is connected to the other of the source and the drain of the transistor 105. Moreover, the conductive film 215 is connected to a conductive film 216. The conductive film 216 is connected to the first terminal 1 in a region 217. Further, the conductive film 216 is connected to the cathode of the light-receiving element 101.

Note that the conductive films 201, 203, 204, 207, 209, 211, 213, and 215 can be formed by processing (patterning) a conductive film formed over one insulating film into desired shapes. Further, the conductive films 205, 208, 210, 212, 214, and 216 can be formed by processing (patterning) a conductive film formed over one insulating film into desired shapes.

In the photo IC of the present invention, a vertical-junction type photodiode is used as the protective diodes 106 to 110 as in the light-receiving element 101. Accordingly, increase in the number of steps for manufacturing the photo IC can be prevented even when the protective diodes 106 to 110 are additionally provided. Further, a vertical-junction type diode can have a larger junction surface than a diode formed using a transistor. Accordingly, the vertical-junction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor. Moreover, the thickness of semiconductor films in the vertical-junction type diode can be thicker than semiconductor films and a gate insulating film of the transistor included in the integrated circuit 102, whereby deterioration or dielectric breakdown by surge current can be prevented.

This embodiment mode can be implemented in combination with other embodiment modes and embodiments as appropriate.

Embodiment Mode 6

Next, a method for manufacturing a photo IC of the present invention will be described in detail. Note that in this embodiment mode, a thin film transistor (TFT) and a vertical-junction type PIN photodiode are shown as examples of semiconductor elements; however, there is no particular limitation on a semiconductor element used in the photo IC of the present invention. For example, a memory element, a resistor, a diode, a capacitor, an inductor, or the like can be used other than a TFT and a PIN photodiode. Further, in the photo IC of the present invention, a vertical-junction type PN photodiode may be used instead of a vertical-junction type PIN photodiode.

First as illustrated in FIG. 11A, an insulating film 401 and a semiconductor film 402 are sequentially formed over a light-transmitting substrate 400. The insulating film 401 and the semiconductor film 402 can be successively formed without exposure to the air.

As the substrate 400, a glass substrate made of barium borosilicate glass, aluminoborosilicate glass, or the like; a quartz substrate; or the like can be used. Although a flexible substrate made of a synthetic resin such as plastic generally tends to have a lower allowable temperature limit than that of the above substrate, a flexible substrate can be used as long as the substrate can endure processing temperature in a manufacturing process. In this embodiment mode, an aluminosilicate glass substrate (product name: AN100, produced by Asahi Glass Co., Ltd.) with a thickness of 0.5 mm, which is alkali-free glass, is used as the substrate 400.

By provision of the insulating film 401, alkaline earth metal or alkali metal such as Na contained in the substrate 400 is prevented from being diffused into the semiconductor film 402 and adversely affecting the characteristics of a semiconductor element such as a transistor. Accordingly, the insulating film 401 is preferably formed using an insulating material with a high barrier property, which can prevent the diffusion of alkali metal or alkaline earth metal into the semiconductor film 402. Note that when a substrate containing alkali metal or alkaline earth metal in some degree, such as a glass substrate or a plastic substrate, is used, it is effective in providing the insulating film 401 between the substrate 400 and the semiconductor film 402 in terms of preventing diffusion of impurities. However, the insulating film 401 is not necessarily provided when a substrate such as a quartz substrate, in which the diffusion of impurities does not lead to a serious problem, is used as the substrate 400.

The insulating film 401 is formed using an insulating material such as silicon oxide, silicon nitride, silicon oxynitride, or silicon nitride oxide by a CVD method, a sputtering method, or the like.

Note that a silicon oxynitride film refers to a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at % to 10 at %, respectively. Further, a silicon nitride oxide film refers to a film that contains more nitrogen than oxygen and, in the case where measurements are performed using RBS and HIFS, includes oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The insulating film 401 may be a single insulating film or a stack of a plurality of insulating films. In this embodiment mode, the insulating film 401 is formed by sequentially stacking a 50-nm-thick silicon nitride oxide film and a 140-nm-thick silicon oxynitride film. However, the material, the thickness, and the number of layers to be stacked of each film are not limited to the above.

A silicon oxide film can be formed using a mixed gas of silane and oxygen, TEOS (tetraethoxysilane) and oxygen, or the like by a thermal CVD method, a plasma CVD method, an atmospheric pressure CVD method, a bias ECRCVD method, or the like. Further, a silicon nitride film can be formed typically using a mixed gas of silane and ammonia by plasma CVD. Furthermore, a silicon oxynitride film and a silicon nitride oxide film can be formed typically using a mixed gas of silane and dinitrogen monoxide by plasma CVD.

The semiconductor film 402 is preferably formed without being exposed to the air after the insulating film 401 is formed. The thickness of the semiconductor film 402 is set in the range of 20 nm to 200 nm (preferably 40 nm to 170 nm, more preferably 50 nm to 150 nm). Note that an amorphous semiconductor, a polycrystalline semiconductor, a microcrystalline (semi-amorphous or microcrystal) semiconductor, or the like can be used for the semiconductor film 402. The semiconductor film 402 can be formed by a sputtering method, an LPCVD method, a plasma CVD method, or the like.

Alternatively, a substrate such as a light-transmitting substrate which uses a single crystal semiconductor and has an SOI structure may be used for the semiconductor film 402 to form a transistor. Accordingly, a small transistor which has high current supply capability and few variations in characteristics, size, shape, or the like and can be formed. By using such a transistor, power consumption of a circuit can be reduced or a circuit can be highly integrated.

In addition, as a semiconductor material used for the semiconductor film 402, a compound semiconductor such as GaAs, InP, SiC, ZnSe, CaN, or SiGe as well as an element such as silicon (Si) or germanium (Ge) can be used. Further, an oxide semiconductor such as zinc oxide (ZnO) or tin oxide ($SnO_2$) can also be used. When ZnO is used for the semiconductor film, it is preferable that a gate insulating film be formed of $Y_2O_3$, $Al_2O_3$, $TiO_2$, a stack of such materials, or the like and a gate electrode and a conductive film which is in contact with the semiconductor film 402 be formed of ITO, Au, Ti, or the like.

When silicon is used as a semiconductor, for example, an amorphous semiconductor film can be obtained by glow discharge decomposition of a gas containing silicon. Examples of the gas containing silicon are $SiH_4$ and $Si_2H_6$. The gas containing silicon may be diluted with hydrogen or with hydrogen and helium.

A microcrystalline semiconductor belongs to a metastable state which is intermediate between an amorphous semiconductor and a single crystal semiconductor when Gibbs free energy is considered. In other words, the microcrystalline semiconductor is a semiconductor having a third state which is stable in terms of free energy and has a short range order and lattice distortion. Columnar-like or needle-like crystals grow in a normal direction with respect to a substrate surface. A Raman spectrum of microcrystalline silicon, which is a typical example of a microcrystalline semiconductor is shifted to the lower wave number side than 520 $cm^{-1}$, which represents single crystal silicon. That is, the peak of the Raman spectrum of microcrystalline silicon lies between 480 $cm^{-1}$ and 520 $cm^{-1}$, which represent amorphous silicon and single crystal silicon, respectively. The semiconductor includes hydrogen or halogen of at least 1 at. % to terminate dangling bonds. Moreover, a rare gas element such as helium, argon, krypton, or neon may be included to further promote lattice distortion, so that the stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically formed using a dilution of a compound which contains silicon such as SiH, $Si_2H_6$, $SiH_2Cl_2$, $SiHCl_3$, $SiCl_4$, or $SiF_4$ with hydrogen. Alternatively, the microcrystalline semiconductor film can be formed by a dilution of a compound containing silicon with one or plural kinds of rare gas elements selected from helium, argon, krypton, or neon, in addition to hydrogen. In such a case, the flow ratio of hydrogen to the compound containing silicon, such as hydrogen silicide, is set to be 5:1 to 200:1, preferably 50:1 to 150:1, more preferably 100:1.

The semiconductor film 402 using polycrystalline silicon can be formed in such a manner that one or a combination of a laser crystallization method, a thermal crystallization method, a thermal crystallization method using a catalytic element which promotes crystallization, such as nickel and the like is performed on an amorphous semiconductor film or a microcrystalline semiconductor film. Alternatively, a polycrystalline semiconductor may be formed directly by a sputtering method, a plasma CVD method, a thermal CVD method, or the like. Further alternatively, a polycrystalline semiconductor may be selectively formed over a substrate by a plasma method. When laser crystallization is performed without introduction of a catalytic element which promotes crystallization, an amorphous semiconductor film is preferably heated at 500° C. in a nitrogen atmosphere for 1 hour before the amorphous semiconductor film is irradiated with laser light so that the concentration of hydrogen contained in the amorphous semiconductor film is $1 \times 10^{20}$ atoms/$cm^3$ or less in order to prevent a phenomenon (ablation) in which the amorphous semiconductor film is scattered by laser light irradiation.

For example, when a polycrystalline semiconductor film is formed by laser crystallization, thermal treatment at 500° C. for 4 hours is performed on the semiconductor film 402 before laser crystallization in order to increase the resistance of the semiconductor film 304 to a laser. Then, by irradiating the semiconductor film 402 with laser light of second to fourth harmonics of the fundamental wave using a solid laser capable of continuous oscillation, a crystal with large grain size can be obtained. Typically, a second harmonic (532 nm) or a third harmonic (355 nm) of an Nd:YVO$_4$ laser (fundamental wave of 1064 nm) is preferably used, for example. Specifically, laser light emitted from a continuous-wave YVO$_4$ laser is converted into the harmonic by a non-linear optical element to obtain laser light having the output of 10 W. Then, it is preferable to shape the laser light into a rectangular or elliptical shape on an irradiation surface by an optical system and irradiate the semiconductor film 402 with the laser light. The power density of the laser light at that time is necessary to range from approximately 0.01 MW/cm$^2$ to 100 MW/cm$^2$ (preferably 0.1 MW/cm$^2$ to 10 MW/cm$^2$). The scanning rate is set to approximately 10 cm/sec to 2000 cm/sec for the irradiation.

As a continuous-wave gas laser, an Ar laser, a Kr laser, or the like can be used. As a continuous-wave solid laser, the following can be used: a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, and the like.

Further, the following pulsed lasers can be used, for example: an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, and a gold vapor laser.

The laser crystallization may be performed by pulsed laser light at a repetition rate of greater than or equal to 10 MHz, which is a considerably higher frequency band than a generally used frequency band of several tens to several hundreds of hertz. It is said that it takes several tens to several hundreds of nanoseconds for the semiconductor film 402 to be completely solidified after being irradiated with pulsed laser light. Accordingly, by using the above repetition rate, the semiconductor film 402 can be irradiated with the next pulsed laser light after it is melted by the pulsed laser beam until it is solidified. Since the solid-liquid interface can be continuously moved in the semiconductor film 402, the semiconductor film 402 having crystal grains that have grown continuously in the scanning direction of the laser light is formed. Specifically, an aggregation of crystal grains each having a width of 10 μm to 30 μm in the scanning direction and a width of approximately 1 μm to 5 μm in the direction perpendicular to the scanning direction can be formed. By forming single crystal grains that have continuously grown in the scanning direction, it is possible to form the semiconductor film 402 having few crystal grains at least in the channel direction of a TFT.

Note that laser crystallization can be performed by irradiation with a fundamental wave of continuous-wave laser light and a harmonic of continuous-wave laser light in parallel. Alternatively, laser crystallization can be performed by irradiation with a fundamental wave of continuous-wave laser light and a harmonic of pulsed laser light in parallel.

Note that laser light irradiation may be performed in an inert gas atmosphere such as a rare gas or nitrogen. Thus, roughness of a semiconductor surface due to laser light irradiation can be prevented, and variation in threshold due to variation in interface state density can be suppressed.

When a thermal crystallization method using a catalytic element which promotes crystallization is used, there is no particular limitation on a method for introducing a catalytic element to an amorphous semiconductor film as long as it is a method for forming the catalytic element on a surface of or inside the amorphous semiconductor film. For example, a sputtering method, a CVD method, plasma treatment (including a plasma CVD method), an adsorption method, or a method of applying a metal salt solution can be used. Among these methods, the method of using a solution is simple, and the concentration of the catalytic element can be easily adjusted. In that case, it is preferable to form an oxide film on the surface of the amorphous semiconductor film by UV light irradiation in an oxygen atmosphere, a thermal oxidation method, treatment with ozone water or hydrogen peroxide including a hydroxyl radical, or the like in order to improve the wettability of the surface of the amorphous semiconductor film and to spread the solution over the entire surface of the amorphous semiconductor film.

Then, after the catalytic element is introduced into the amorphous semiconductor film, thermal treatment (at temperatures from 550° C. to 750° C. for 3 minutes to 24 hours) is performed, so that a polycrystalline semiconductor film can be performed. The catalytic element which promotes crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

After the above crystallization is performed, the catalytic element which promotes crystallization is removed from the polycrystalline semiconductor film, and a semiconductor film containing an impurity element is formed in contact with the polycrystalline semiconductor film in order to reduce the concentration of the catalytic element. The semiconductor film containing the impurity element functions as a gettering sink. As the impurity element, an impurity element imparting n-type conductivity, an impurity element imparting p-type conductivity, a rare gas element, or the like can be used. For example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. Then, a semiconductor film containing a rare gas element is formed in contact with the polycrystalline semiconductor film containing the catalytic element which promotes crystallization, and thermal treatment (at temperatures from 550° C. to 750° C. for 3 minutes to 24 hours) is performed. With the above thermal treatment, the catalytic element promoting crystallization, which is contained in the polycrystalline semiconductor film, is moved to the semiconductor film containing the rare gas element, and the concentration of the catalytic element promoting crystallization, which is contained in the polycrystalline semiconductor film, is reduced. After that, the semiconductor film containing the rare gas element, which serves as the gettering sink, is removed.

In this embodiment mode, the semiconductor film 402 using polycrystalline silicon is formed by a combination of the crystallization method using a catalytic element and the laser crystallization method. A method for manufacturing the semiconductor film 402 in this embodiment mode will be specifically described below.

In this embodiment mode, first, an amorphous silicon film with a thickness of 50 nm is formed over the insulating film 401, and then, a nickel acetate solution containing nickel of 10 ppm by weight is applied to the amorphous silicon film by a spinner. Note that a nickel element may be dispersed over the entire surface by a sputtering method instead of a method of adding a catalytic element using a solution. Next, after thermal treatment (500° C. for 1 hour), thermal treatment (550° C. for 4 hours) for crystallization is performed to crystallize the amorphous silicon film, whereby the semiconductor film 402 containing polycrystalline silicon is formed.

Then, an oxide film formed on a surface of the semiconductor film 402 containing polycrystalline silicon is removed with dilute hydrofluoric acid or the like. After that, laser light (XeCl: wavelength of 308 nm) irradiation for increasing the degree of crystallinity and reducing defects left in a crystal grain is performed in the air or an oxygen atmosphere.

For the laser light, excimer laser light with a wavelength of 400 nm or less, or the second harmonic or the third harmonic of a YAG laser is used. Here, a surface of the silicon film may scanned in such a manner that pulsed laser light with a repetition rate of approximately 10 Hz to 1000 Hz is used, the laser light is condensed to 100 mJ/cm$^2$ to 500 mJ/cm$^2$ by an optical system, and irradiation is performed with an overlap rate of 90% to 95%. In this embodiment mode, irradiation with laser light having a repetition rate of 30 Hz and a power density of 470 mJ/cm$^2$ is performed in the air.

Note that since the above laser light irradiation is conducted in the air or an oxygen atmosphere, an oxide film is formed on the surface by the laser light irradiation. Although this embodiment mode shows an example in which the pulsed laser is used, a continuous-wave laser may be used. In order to obtain a crystal with large grain size at the time of crystallization of a semiconductor film, it is preferable to use a solid laser which is capable of continuous oscillation and to apply second to fourth harmonics of a fundamental wave. Typically, the second harmonic (532 nm) or the third harmonic (355 nm) of an Nd:YVO$_4$ laser (fundamental wave of 1064 nm) may be used.

When a continuous-wave laser is used, laser light emitted from a continuous-wave YVO$_4$ laser with 10 W output is converted into harmonics by a non-linear optical element. Alternatively, the harmonic may be emitted by setting YVO$_4$ crystals and a non-linear optical element in a resonator. Then, it is preferable to shape the laser light into a rectangular or elliptical shape on an irradiation surface by an optical system and irradiate an object to be processed with the laser light. The power density of the laser light at that time is necessary to range from approximately 0.01 MW/cm$^2$ to 100 MW/cm$^2$ (preferably 0.1 MW/cm$^2$ to 10 MW/cm$^2$). Then, laser light may be delivered to the semiconductor film while the semiconductor film is moved at a speed of approximately 10 cm/s to 2000 cm/s relatively to the laser light.

Next, in addition to the oxide film formed by the above laser light irradiation, a surface of the polycrystalline semiconductor film after the laser crystallization is treated with ozone water for 120 seconds, so that a barrier layer which is formed of oxide films with a thickness of 1 nm to 5 nm in total is formed. The barrier layer is formed in order to remove a catalytic element added for crystallization, such as nickel (Ni), from the polycrystalline semiconductor film. Here, the barrier layer is formed using ozone water Alternatively, the barrier layer may be formed by depositing an oxide film with a thickness of approximately 1 nm to 10 nm by a plasma CVD method, a sputtering method, an evaporation method, or the like; by a method of oxidizing a surface of a semiconductor film having a crystalline structure by ultraviolet irradiation in an oxygen atmosphere or by oxygen plasma treatment, or the like. Moreover, before the barrier layer is formed, the oxide film formed by laser light irradiation may be removed.

Then, over the barrier layer, an amorphous silicon film containing an argon element is formed to a thickness of 10 nm to 400 nm, for example 100 nm here, by a sputtering method to serve as a gettering site. Here, the amorphous silicon film containing the argon element is formed using a silicon target in an atmosphere containing argon. When the amorphous silicon film containing the argon lement is formed by a plasma CVD method, the deposition conditions are as follows: the flow ratio of monosilane to argon (SiH$_4$:Ar) is 1:99; the deposition pressure is 6.665 Pa; the RF power density is 0.087 W/cm$^2$; and the deposition temperature is 350° C.

After that, thermal treatment in a furnace heated at 650° C. is performed for 3 minutes to remove (getter) the catalytic element. Accordingly, the concentration of the catalytic element in the semiconductor film 402 having a crystalline structure is reduced. A lamp annealing apparatus may be used instead of the furnace.

Next, after the amorphous silicon film containing the argon element, which is a gettering site, is selectively removed using the barrier layer as an etching stopper, the barrier layer is selectively removed by dilute hydrofluoric acid. Note that since nickel is likely to move to the region where the oxygen concentration is high at the time of gettering, the barrier layer formed of the oxide film is preferably removed after the gettering.

Note that when a semiconductor film is not crystallized using a catalytic element, the above steps such as the formation of the barrier layer, the formation of the gettering site, the thermal treatment for gettering, the removal of the gettering site, and the removal of the barrier layer are not necessary.

After the semiconductor film 402 is formed as described above, the semiconductor film 402 is subjected to channel doping, in which an impurity element imparting p-type conductivity or an impurity element imparting n-type conductivity is added at a low concentration. The channel doping may be performed on the entire semiconductor film 402 or a selected part of the semiconductor film 402. As the impurity element imparting p-type conductivity, boron (B), aluminum (Al), gallium (Ga), or the like can be used. As the impurity element imparting n-type conductivity, phosphorus (P), arsenic (As), or the like can be used. Here, boron (B) is used as the impurity element and added so as to be contained at a concentration of $1\times10^{16}$ atmos/cm$^3$ to $5\times10^{17}$ atmos/cm$^3$.

Next, the semiconductor film 402 is processed (patterned) into a desired shape by etching, so that semiconductor films 403 and 404 which are separated into island shapes are formed as illustrated in FIG. 11B. Note that the above channel doping may be performed on the semiconductor films 403 and 404 which have been subjected to patterning instead of on the semiconductor film 402.

Subsequently, as illustrated in FIG. 11C, transistors 405 and 406 are formed using the semiconductor films 403 and 404, respectively. Specifically, a gate insulating film 407 is formed so as to cover the semiconductor films 403 and 404. Then, conductive films 408 and 409 which are processed (patterned) into a desired shape are formed over the gate insulating film 407. The conductive films 408 and 409 are sequentially stacked over the gate insulating film 407. The conductive films 408 and 409 which overlap with the semiconductor film 403 function as a gate electrode 410 of the transistor 405. The conductive films 408 and 409 which overlap with the semiconductor film 404 function as a gate electrode 411 of the transistor 406.

Next, an impurity imparting n-type or p-type conductivity is added to the semiconductor films 403 and 404 using the conductive films 408 and 409 or a resist which is patterned as a mask, so that a source region, a drain region, an impurity region functioning as an LDD region, and the like are formed. Note that FIG. 11C illustrates the case where both of the transistors 405 and 406 are n-channel transistors. Alternatively, one or both of the transistors 405 and 406 may be p-channel transistors.

Note that as the gate insulating film 407, a single layer or a stack of a silicon oxide film, a silicon nitride film, a silicon oxynitride film, a silicon nitride oxide film, or the like can be used, for example. In the case of employing a stacked structure, it is preferable to employ a three-layer structure in which, for example, a silicon oxide film, a silicon nitride film, and a silicon oxide film are sequentially stacked from the substrate 400 side. Moreover, the gate insulating film 407 can be formed by a plasma CVD method, a low pressure CVD method, a sputtering method, or the like. For example, when the gate insulating film 407 using silicon oxide is formed by a plasma CVD method, a gas in which TEOS (tetraethyl orthosilicate) and $O_2$ are mixed is used, the reaction pressure is set to 40 Pa, the substrate temperature is set to 300° C. to 400° C., and the high-frequency (13.56 MHz) power density is set to 0.5 W/cm$^2$ to 0.8 W/cm$^2$.

The gate insulating film 407 may be formed by oxidizing or nitriding surfaces of the semiconductor films 403 and 404 by high-density plasma treatment. High-density plasma treatment is performed using, for example, a mixed gas of a rare gas such as He, Ar, Kr, or Xe; and oxygen, nitrogen oxide, ammonia, nitrogen, or hydrogen. In that case, by exciting plasma by introduction of microwaves, plasma with a low electron temperature and high density can be generated. By oxidizing or nitriding the surfaces of the semiconductor films 403 and 404 by an oxygen radical (an OH radical may be included) or a nitrogen radical (an NH radical may be included) generated by such high density plasma, an insulating film with a thickness of 1 nm to 20 nm, typically 5 nm to 10 nm is formed so as to be in contact with the semiconductor films 403 and 404. The insulating film with a thickness of 5 nm to 10 nm may be used as the gate insulating films 407.

Oxidation or nitridation of the semiconductor film by the above high-density plasma treatment proceeds by solid-phase reaction; accordingly, the interface state density between the gate insulating film and the semiconductor film can be drastically reduced. Moreover, by directly oxidizing or nitriding the semiconductor film by high-density plasma treatment, variation in thickness of an insulating film to be formed can be suppressed. Further, when the semiconductor film has crystallinity, by oxidizing a surface of the semiconductor film by solid-phase reaction with high-density plasma treatment, rapid oxidation can be prevented only in a crystal grain boundary; thus, a gate insulating film with good uniformity and low interface state density can be formed. A transistor in which an insulating film formed by high-density plasma treatment is used as part of or the entire gate insulating film can suppress variation in characteristics.

Alternatively, aluminum nitride can be used for the gate insulating film 407. Aluminum nitride has a relatively high thermal conductivity and can efficiently diffuse heat generated in a transistor Further alternatively, a stack in which silicon oxide, silicon oxynitride, or the like which does not contain aluminum is formed and then aluminum nitride is stacked thereon may be used as the gate insulating film.

In this embodiment mode, the gate insulating film 407 which contains silicon oxynitride and has a thickness of 30 nm is formed using nitrous oxide ($N_2O$) and silane ($SiH_4$) at a pressure of 10 Pa to 30 Pa by a vapor growth method with a microwave (2.45 GHz) power of 3 kW to 5 kW. By a combination of solid-phase reaction and reaction due to vapor deposition, the gate insulating film 407 with low interface state density and high withstand voltage can be formed.

Alternatively, for the gate insulating film 407, a high dielectric constant material such as zirconium dioxide, hafnium oxide, titanium dioxide, or tantalum pentoxide may be used. When a high dielectric constant material is used for the gate insulating film 407, gate leakage current can be reduced.

In this embodiment mode, the gate electrodes 410 and 411 are formed using a stack of two conductive films 408 and 409; however, the present invention is not limited to this structure. Instead of using the conductive films 408 and 409, the gate electrodes 410 and 411 may be formed using a single conductive film or a stack of three or more conductive films. In the case of employing a three-layer structure in which three or more conductive films are stacked, it is preferable to form a stacked structure of a molybdenum film, an aluminum film, and a molybdenum film.

For the conductive film for forming the gate electrodes 410 and 411, the following element can be used: tantalum (Ta), tungsten (W), titanium (Ti), molybdenum (Mo), aluminum (Al), copper (Cu), chromium (Cr), niobium (Nb), neodymium (Nd), cobalt (Co), zirconium (Zr), zinc (Zn), ruthenium (Ru), rhodium (Rh), palladium (Pd), osmium (Os), iridium (Ir), platinum (Pt), gold (Au), silver (Ag), or the like. Alternatively, an alloy containing the above metal as a main component or a compound containing the above metal can be used. Further alternatively, the conductive film may be formed using a semiconductor such as polycrystalline silicon obtained by doping a semiconductor film with an impurity element imparting conductivity, such as phosphorus.

Alternatively, for the conductive film for forming the gate electrodes 410 and 411, a conductive material capable of transmitting visible light can be used. As the light-transmitting conductive material, indium tin oxide (ITO), indium tin oxide containing silicon oxide (ITSO), organic indium, organic tin, zinc oxide, or the like can be used. Moreover, for the conductive film for forming the gate electrodes 410 and 411, indium zinc oxide (ZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

In this embodiment mode, tantalum nitride or tantalum (Ta) is used for the first-layer conductive film 408, and tungsten (W) is used for the second-layer conductive film 409. As a combination of two conductive films, examples other than the example described in this embodiment mode are as follows: tungsten nitride and tungsten; molybdenum nitride and molybdenum; aluminum and tantalum; and aluminum and titanium. Since tungsten and tantalum nitride have high heat resistance, thermal treatment for thermal activation can be performed in a step subsequent to the formation of the two conductive films. Alternatively, as a combination of two conductive films, silicon doped with an impurity imparting n-type conductivity and nickel silicide, or Si doped with an impurity imparting n-type conductivity and $WSi_x$ can be used, for example.

The conductive films 408 and 409 can be formed by a CVD method, a sputtering method, or the like. When the gate electrodes 410 and 411 are formed of the above two conductive films, the first-layer conductive film 408 is formed to a thickness of 20 nm to 100 nm, and the second-layer conductive film 409 is formed to a thickness of 100 nm to 400 nm. In this embodiment mode, the first-layer conductive film 408 which contains tantalum nitride or tantalum (Ta) is formed to a thickness of 30 nm, and the second-layer conductive film 409 which contains tungsten (W) is formed to a thickness of 170 nm.

Note that as a mask used for forming the gate electrodes 410 and 411, silicon oxide, silicon oxynitride, or the like may be used instead of a resist. In that case, a step for forming a mask of silicon oxide, silicon oxynitride, or the like is added. Since reduction in thickness of the mask in etching is less than that in the case of using a resist, the gate electrodes 410 and 411 having a desired shape can be formed. Alternatively, the gate electrodes 410 and 411 may be selectively formed by a droplet discharging method without using a mask. Note that a droplet discharging method refers to a method of forming a predetermined pattern by discharging or ejecting a droplet containing a predetermined composition from a small nozzle and includes an inkjet method in its category.

An optimum etching method and kind of etchant are selected as appropriate depending on a material of a conductive film used for forming the gate electrodes 410 and 411. An example of an etching method in the case where tantalum nitride is used for the first-layer conductive film 408 and tungsten is used for the second-layer conductive film 409 will be specifically described below.

First, a tantalum nitride film is formed, and after that, a tungsten film is formed over the tantalum nitride film. Then, a mask is formed over the tungsten film, and first etching is performed. In the first etching, first etching conditions are used, and then, second conditions are used. The first etching conditions are as follows: an inductively coupled plasma (ICP) etching method is used; $CF_4$, $Cl_2$, and $O_2$ are used as etching gases and the gas flow ratio thereof is 25:25:10 (sccm); and an RF (13.56 MHz) power of 500 W is applied to a coiled electrode at a pressure of 1 Pa to generate plasma, whereby etching is conducted. Then, an RF (13.56 MHz) power of 150 W is applied to the substrate side (a sample stage), so that negative self-bias voltage is substantially applied. By using the first etching conditions, the tungsten film can be etched so that edge portions thereof are tapered.

Next, etching is performed under the second etching conditions. The second etching conditions are as follows: $CF_4$ and $Cl_2$ are used as etching gases and the gas flow ratio thereof is 30:30 (sccm); and an RF (13.56 MHz) power of 500 W is applied to a coiled electrode at a pressure of 1 Pa to generate plasma, whereby etching is conducted for approximately 30 seconds. An RF (13.56 MHz) power of 20 W is applied to the substrate side (the sample stage), so that negative self-bias voltage is substantially applied. Under the second etching conditions in which $CF_4$ and $Cl_2$ are mixed, the tungsten film and the tantalum nitride film are etched to almost the same degree.

In the first etching, by forming the mask into a suitable shape, edge portions of the tantalum nitride film and the tungsten film are tapered with an angle of approximately 15° to 45° due to effect of the bias voltage applied to the substrate side. Note that although depending on the etching conditions, a part of the gate insulating film 407, which is exposed by the first etching, is a little thinner by etching than the other part of the gate insulating film 407, which is covered with the tantalum nitride film and the tungsten film.

Next, second etching is performed without removing the mask. In the second etching, $CF_4$, $Cl_2$, and $O_2$ are used as etching gases, and the tungsten film is selectively etched. At that time, the tungsten film is preferentially etched, whereas the tantalum nitride film is hardly etched.

By the above first etching and second etching, the conductive film 408 using tantalum nitride and the conductive film 409 using tungsten, which is narrower than the conductive film 408, can be formed.

Next, an impurity imparting one conductivity is introduced into the semiconductor films 403 and 404, so that impurity regions of the transistors 405 and 406 are formed. In this embodiment mode, an n-channel transistor is formed; therefore, an impurity imparting n-type conductivity, for example, phosphorus (P) or arsenic (As) is introduced into the semiconductor films 403 and 404. When a p-channel transistor is formed, an impurity imparting p-type conductivity, for example, boron (B) may be introduced into the semiconductor films 403 and 404.

By using the conductive films 408 and 409 formed by the above first etching and second etching as masks, the source region, the drain region, and the impurity region functioning as an LDD region can be selectively formed in the semiconductor films 403 and 404 without forming an additional mask.

Through a series of the above steps, the transistors 405 and 406 can be formed. Note that the method for manufacturing the transistor is not limited to the above steps.

Note that this embodiment mode exemplifies a single-gate transistor. Alternatively, a multi-gate structure such as a double-gate structure may be employed. Further, a transistor or the like formed by an inkjet method or a printing method can also be used. Accordingly, transistors can be formed at room temperature, can be formed at a tow vacuum, or can be formed using a large substrate. Moreover, since the transistor can be manufactured without using a mask (a reticle), a layout of the transistor can be easily changed. Further, since it is not necessary to use a resist, the material cost is reduced and the number of steps can be reduced. Furthermore, since a film is formed only in a necessary portion, a material is not wasted compared to a manufacturing method in which etching is performed after a film is formed over the entire surface, so that the cost can be reduced.

Moreover, a transistor or the like including an organic semiconductor can be used. Accordingly, a transistor can be formed using a flexible substrate, whereby a photo IC that is highly resistant to shock can be formed.

Figure 12A:
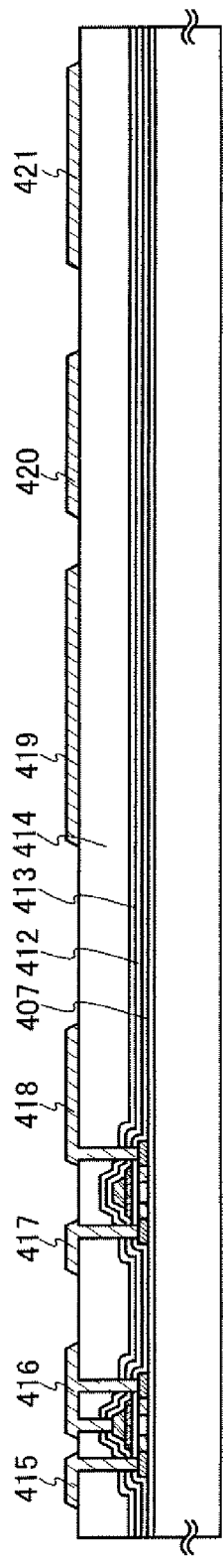
FIGS. 12A to 12C illustrate a method for manufacturing a photo IC.

Next, as illustrated in FIG. 12A, an insulating film 412 is formed so as to cover the transistors 405 and 406. Although the insulating film 412 is not necessarily provided, the provision of the insulating film 412 can prevent impurities such as alkali metal and alkaline earth metal from entering the transistors 405 and 406. Specifically, it is preferable to use silicon nitride, silicon nitride oxide, silicon oxynitride, aluminum nitride, aluminum oxide, silicon oxide, or the like for the insulating film 412. In this embodiment mode, a silicon oxynitride film with a thickness of approximately 30 nm is formed by a CVD method and used as the insulating film 412.

After the insulating film 412 is formed, the impurity region may be activated by thermal treatment. For example, thermal treatment is performed at 480° C. in a nitrogen atmosphere for 1 hour. In the thermal treatment, a thermal annealing method using an annealing furnace, a laser annealing method, a rapid thermal annealing method (an RTA method), or the like can be used.

Then, an insulating film 413 and an insulating film 414 are sequentially stacked over the insulating film 412. For the insulating films 413 and 414, an organic material having heat resistance, such as acrylic, polyimide, benzocyclobutene, polyamide, or epoxy can be used. In addition to such organic materials, it is also possible to use a low-dielectric constant material (a low-k material), a siloxane resin, silicon oxide, silicon nitride, silicon oxynitride, silicon nitride oxide, PSG (phosphosilicate glass), BPSG (borophosphosilicate glass), alumina, or the like. A siloxane resin is a material in which a skeleton structure is constructed by the bond of silicon (Si) and oxygen (O). As a substituent, at least one kind selected from fluorine, a fluoro group, an organic group (e.g., an alkyl group or aromatic hydrocarbon) may be used in addition to hydrogen. Note that insulating films formed of these materials may be stacked to form the insulating films 413 and 414.

The insulating films 413 and 414 can be formed by the following method depending on the material thereof: a CVD method, a sputtering method, an SOG method, a spin coating method, a dip coating method, a spray coating method, a droplet discharging method (e.g., an ink-jet method, screen printing, or offset printing), a doctor knife, a roll coater, a curtain coater, a knife coater, or the like.

In this embodiment mode, the insulating film 413 is a silicon nitride oxide film which is formed to a thickness of 100 nm by a CVD method and contains hydrogen, and the insulating film 414 is a silicon oxynitride film which is formed to a thickness of 900 nm by a CVD method.

Note that in this embodiment mode, the insulating films 412, 413, and 414 function as an interlayer insulating film. Alternatively, a single insulating film, a stack of two insulating films, or a stack of four or more insulating films may be used as an interlayer insulating film.

Then, thermal treatment is preferably conducted at temperatures from 300° C. to 550° C. for 1 to 12 hours. In this embodiment mode, thermal treatment is performed at 410° C. in a nitrogen atmosphere for 1 hour. With the above thermal treatment, dangling bonds in the semiconductor films 403 and 404 can be terminated by hydrogen contained in the insulating film 413. In the thermal treatment, a thermal annealing method using an annealing furnace, a laser annealing method, a rapid thermal annealing method (an RTA method), or the like can be used. By the thermal treatment, not only hydrogenation but also activation of the impurity element added into the semiconductor films 403 and 404 can be accomplished. Alternatively, plasma hydrogenation (using hydrogen excited by plasma) may be performed as another method of hydrogenation for terminating dangling bonds.

Note that when an insulating film using siloxane is used as the insulating film 414, the following steps may be conducted: after the insulating film 413 is formed, thermal treatment for hydrogenating the semiconductor films 403 and 404 is performed, and then, the insulating film 414 is formed.

Next, contact holes are formed in the gate insulating film 407 and the insulating films 412, 413, and 414 so that part of the semiconductor films 403 and 404 is exposed. Then, conductive films 415 and 416 which are in contact with the semiconductor film 403 through the contact hole, conductive films 417 and 418 which are in contact with the semiconductor film 404 through the contact hole, and conductive films 419 to 421 are formed. Note that the conductive film 416 is in contact with the gate electrode 410 as well as the semiconductor film 403.

The conductive films 415 to 421 can be formed by a CVD method, a sputtering method, or the like. Specifically, for the conductive films 415 to 421, tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing the above element as a main component or a compound containing the above element can be used. As the conductive films 415 to 421, a single film containing the above element or a stack of a plurality of films containing the above element can be used.

In particular, titanium, molybdenum, an alloy containing titanium or molybdenum as its main component, and a compound containing titanium or molybdenum are suitable to be used as the conductive films 418, 419, and 420 because they have high heat resistance, galvanic corrosion does not easily occur in a portion in contact with a semiconductor film of a photodiode which is formed later, and diffusion of a material of the conductive film into the semiconductor film can be suppressed. In this embodiment mode, a 400-nm-thick titanium film is formed over the insulating film 414 and processed into a desired shape, so that the conductive films 415 to 421 are formed.

Figure 12B:
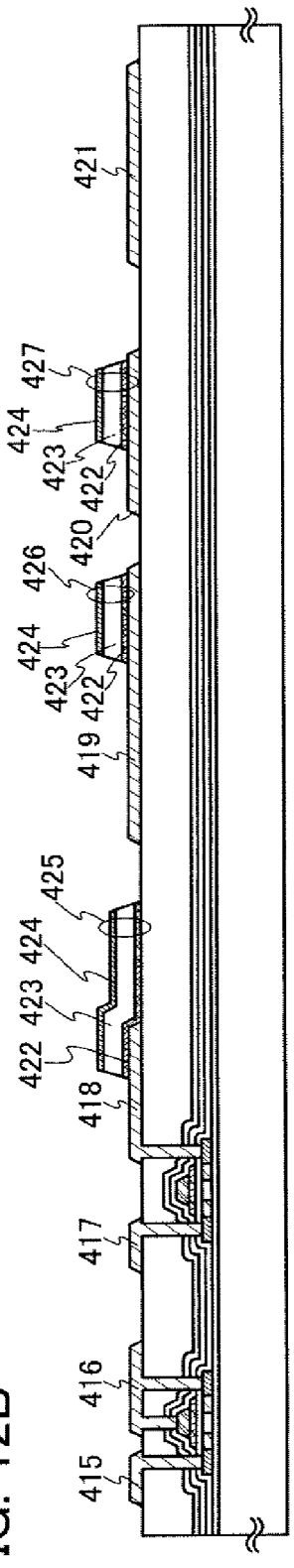

Next, as illustrated in FIG. 12B, a semiconductor film 422 having p-type conductivity, a semiconductor film 423 having i-type conductivity, and a semiconductor film 424 having n-type conductivity are sequentially stacked over the insulating film 414, and these stacked semiconductor films are processed into a desired shape. Accordingly, photodiodes 425 to 427 are formed.

The p-type semiconductor film 422 included in the photodiode 425 is in contact with the conductive film 418. The p-type semiconductor film 422 included in the photodiode 426 is in contact with the conductive film 419. Moreover, the p-type semiconductor film 422 included in the photodiode 427 is in contact with the conductive film 420.

The p-type semiconductor film 422 may be formed by depositing a semi-amorphous (also referred to as microcrystalline or microcrystal) silicon film containing an impurity element belonging to Group 13 of the periodic table, such as boron (B), by a plasma CVD method.

One example of a method for forming a microcrystalline silicon film is a method in which a microcrystalline silicon film is deposited by glow discharge plasma by mixing a silane gas and hydrogen and/or a rare gas. Since silane is diluted 10 times to 2000 times with hydrogen and/or a rare gas, a large amount of hydrogen and/or the rare gas is needed. The substrate heating temperature is 100° C. to 300° C., preferably 120° C. to 220° C. It is preferable that a growing surface of the microcrystalline silicon film be inactivated with hydrogen and deposition be performed at temperatures from 120° C. to 220° C. in order to promote the growth of microcrystalline silicon. During the deposition treatment, crystal growth occurs with a $SiH$ radical, a $SiH_2$ radical, and a $SiH_3$ radical, which are active species, based on crystal nuclei. Further, germanium hydride or germanium fluoride such as $GeH_4$ or $GeF_4$ may be mixed into a gas such as silane or carbon or germanium may be added to silicon in order to adjust the width of the energy band. The width of the energy band is increased when carbon is added to silicon, whereas the width of the energy band is reduced when germanium is added to silicon.

As the i-type semiconductor film 423, a microcrystalline silicon film may be formed by a plasma CVD method, for example. Note that an i-type semiconductor refers to a semiconductor in which an impurity imparting p-type or n-type conductivity has a concentration of $1 \times 10^{20}$ $cm^{-3}$ or less, oxygen and nitrogen have a concentration of $1 \times 10^{19}$ $cm^{-3}$ or less, and the photoconductivity is 100 times or more than the dark conductivity. The i-type semiconductor may contain an impurity element belonging to Group 13 or Group 15 of the periodic table. That is, the i-type semiconductor exhibits weak n-type conductivity when an impurity element for controlling valence electrons is not intentionally added. Accordingly, an i-type semiconductor film includes, in its category, a film to which an impurity imparting p-type conductivity is added intentionally or unintentionally at the same time as or after the film formation.

Note that as the n-type semiconductor film 424, a microcrystalline silicon film containing an impurity element belonging to Group 15 of the periodic table, for example, phosphorus (P) may be formed. Alternatively, after a microcrystalline silicon film is formed, an impurity element belonging to Group 15 of the periodic table may be introduced.

In addition, for the p-type semiconductor film 422, the i-type semiconductor film 423, and the n-type semiconductor film 424, an amorphous semiconductor may be used other than a microcrystalline semiconductor. Alternatively, a polycrystalline semiconductor formed by the above catalyst or laser crystallization process, or a single crystal semiconductor formed by Smart Cut (registered trademark) may be used for the p-type semiconductor film 422, the i-type semiconductor film 423, and the n-type semiconductor film 424. In a photodiode formed using a microcrystalline semiconductor or a single crystal semiconductor, variation in characteristics in a substrate can be reduced.

In this embodiment mode, the photodiodes 425 to 427 are formed so that the p-type semiconductor film 422 is 60 nm thick, the i-type semiconductor film 423 is 400 nm thick, and the n-type semiconductor film 424 is 80 nm thick.

Figure 12C:
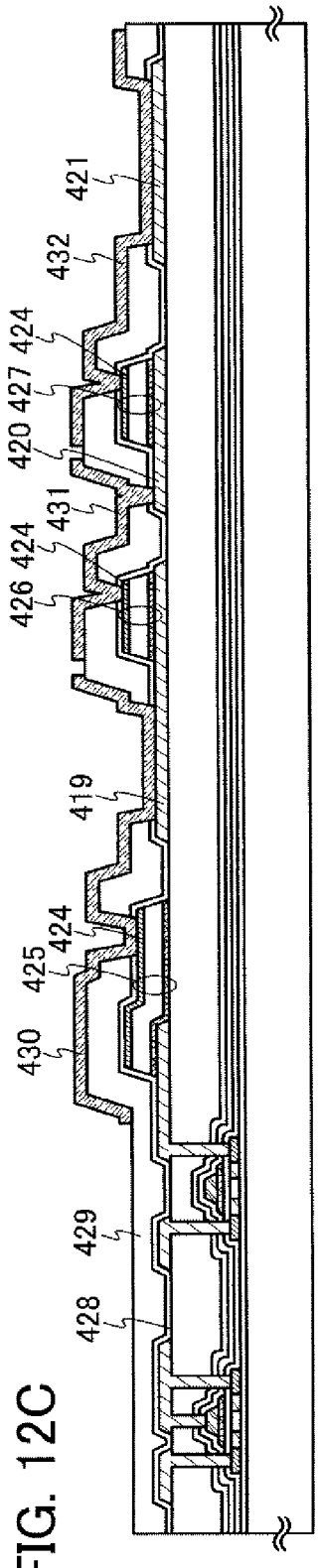

Next, as illustrated in FIG. 12C, an insulating film 428 is formed over the insulating film 414 so as to cover the conductive films 415 to 421 and the photodiodes 425 to 427. The insulating film 428 is preferably formed of an insulating material with a high barrier property, which can prevent moisture or impurities such as an organic substance from being mixed into the photodiodes 425 to 427 or the transistors 405 and 406. For example, the insulating film 428 may be formed using a material such as silicon oxide, silicon nitride, silicon oxynitride, silicon nitride oxide, aluminum nitride, or diamond like carbon (DLC) by a CVD method, a sputtering method, or the like. In this embodiment mode, a 100-nm-thick silicon nitride film formed by a CVD method is used as the insulating film 428.

Then, an insulating film 429 is formed over the insulating film 428. An organic material having heat resistance, such as acrylic, polyimide, benzocyclobutene, polyamide, or epoxy can be used for the insulating film 429. In addition to such organic materials, it is also possible to use a low-dielectric constant material (a low-k material), a siloxane resin, silicon oxide, silicon nitride, silicon oxynitride, silicon nitride oxide, PSG (phosphosilicate glass), BPSG (borophosphosilicate glass), alumina, or the like.

In this embodiment mode, an 800-nm-thick silicon oxide film formed using an organosilane gas by a chemical vapor deposition method is used as the insulating film 429. As the organosilane gas, a silicon-containing compound such as tetraethoxysilane (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Next, contact holes are formed in the insulating films 428 and 429 so that the conductive films 419 to 421 and the n-type semiconductor films 424 included in the photodiodes 425 to 427 are partly exposed. Then, a conductive film 430 which is in contact with the n-type semiconductor film 424 of the photodiode 425 and the conductive film 419, a conductive film 431 which is in contact with the n-type semiconductor film 424 of the photodiode 426 and the conductive film 420, and a conductive film 432 which is in contact with the n-type semiconductor film 424 of the photodiode 427 and the conductive film 421 are formed over the insulating film 429.

The conductive films 430 to 432 can be formed by a CVD method, a sputtering method, or the like. Specifically, for the conductive films 430 to 432, tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing the above element as a main component or a compound containing the above element can be used. As the conductive films 430 to 432, a single film containing the above element or a stack of a plurality of films containing the above element can be used.

In particular, titanium, molybdenum, an alloy containing titanium or molybdenum as its main component, and a compound containing titanium or molybdenum are suitable to be used as the conductive films 430 to 432 because they have high heat resistance, galvanic corrosion does not easily occur in a portion in contact with the n-type semiconductor film 424, and diffusion of a material of the conductive film into the n-type semiconductor film 424, the i-type semiconductor film 423, and the p-type semiconductor film 422 can be suppressed. In this embodiment mode, a 200-nm-thick titanium film is formed over the insulating film 429 by a sputtering method and processed into a desired shape, so that the conductive films 430 to 432 are formed.

Next, as illustrated in FIG. 13A, an insulating film 433 is formed over the insulating film 429 so as to cover the conductive films 430 to 432. The insulating film 433 can be formed of an insulating material with a high barrier property, which can prevent moisture or impurities such as an organic substance from being mixed into the photodiodes 425 to 427 or the transistors 405 and 406. For example, the insulating film 433 may be formed using a material such as silicon oxide, silicon nitride, silicon oxynitride, silicon nitride oxide, aluminum nitride, or diamond like carbon (DLC) by a CVD method, a sputtering method, or the like. In this embodiment mode, a 100-nm-thick silicon nitride film formed by a CVD method is used as the insulating film 433.

Note that after the photodiodes 425 to 427 are formed and before the insulating film 428 is formed, the insulating films 413 and 414 may be partly removed by etching in an outer edge portion of a photo IC. In that case, edge portions of the insulating films 413 and 414 and part of the insulating film 412, which is exposed in the outer edge portion of the photo IC, are covered with the insulating film 428 which is formed later. Further, after the conductive films 430 to 432 are formed and before the insulating film 433 is formed, the insulating films 429, 428, and 412 and the gate insulating film 407 may be partly removed by etching in the outer edge portion of the photo IC where the insulating films 413 and 414 are removed. In that case, edge portions of the insulating films 429, 428, and 412 and the gate insulating film 407 and part of the insulating film 401, which is exposed in the outer edge portion of the photo IC, are covered with the insulating film 433 which is formed later. With the above structure, the photodiodes 425 to 427 and the transistors 405 and 406 can be surrounded by the insulating films 428 and 433 with high barrier properties. Accordingly, mixing of moisture or impurities such as an organic substance into the photodiodes 425 to 427 or the transistors 405 and 406 can be more effectively prevented.

Then, a sealing film 434 with a thickness of approximately 1 μm to 30 μm is formed over the insulating film 433. By forming the sealing film 434, semiconductor elements such as the photodiodes 425 to 427 and the transistors 405 and 406 can be protected from external stress. In this embodiment mode, the sealing film 434 with a thickness of 25 μm is formed using Ohmcoat 1012B (produced by Namics Corporation), which is a photosensitive epoxy-phenol-based resin.

Next, as illustrated in FIG. 13B, after the sealing film 434 is partly removed, contact holes are formed in the insulating film 433 so as to partly expose the conductive films 430 and 432. Then, a conductive film 435 connected to the conductive film 430 through the contact hole and a conductive film 436 connected to the conductive film 432 through the contact hole are formed over the sealing film 434 by using a conductive paste in which conductive particles with a grain size of several nanometers to several tens of micrometers are dissolved or dispersed in an organic resin. The conductive films 435 and 436 are formed to a thickness of 1 μm to several tens of μm, preferably 10 μm to 20 μm, by a printing method such as a screen printing method. As the conductive particle, a metal particle of at least one of silver (Ag), gold (Au), copper (Cu), nickel (Ni), platinum (Pt), palladium (Pd), tantalum (Ta), molybdenum (Mo), and titanium (Ti); or a fine particle of silver halide can be used. Moreover, as the organic resin included in the conductive paste, one or more selected from organic resins functioning as a binder, a solvent, a dispersing agent, and a coating material of the metal particle can be used. Typically, an organic resin such as an epoxy resin, a silicone resin, and the like can be used. Further, in forming the conductive films 435 and 436, a conductive paste is preferably baked after the paste is printed. In this embodiment mode, each of the conductive films 435 and 436 is formed to a thickness of approximately 15 μm with a paste in which nickel is used for the conductive particle.

Note that the resin used for the sealing film 434 and the conductive paste used for the conductive films 435 and 436 contain a relatively large amount of water as compared to an inorganic insulating film. As described above, the photodiodes 425 to 427 and the transistors 405 and 406 are surrounded by the insulating films 428 and 433 with high barrier properties, whereby moisture or impurities such as an organic substance can be prevented from being mixed into the photodiodes 425 to 427 or the transistors 405 and 406, which is preferable.

Note that since the conductive films 435 and 436 are formed using the resin, they have high planarity and low adhesion to solder. Therefore, a conductive film 440 is formed over the conductive film 435 by using a conductive material with high adhesion to solder, and a conductive film 441 is formed over the conductive film 436 by using a conductive material with high adhesion to solder. In this embodiment mode, the conductive films 440 and 441 in each of which a titanium film 437 with a thickness of 150 nm, a nickel film 438 with a thickness of 750 nm, and a gold film 439 with a thickness of 50 nm are sequentially stacked are formed over the conductive films 435 and 436, respectively, by a sputtering method.

In this embodiment mode, the conductive films 435 and 440 function as a first terminal 1, and the conductive films 436 and 441 function as a second terminal 2.

Through a series of the above steps, the photo IC of the present invention can be formed.

In the top view illustrated in FIG. 10, the light-receiving element 101 corresponds to the photodiode 425 in FIG. 12B, and the protective diodes 109 and 110 correspond to the photodiodes 426 and 427 in FIG. 12B.

Accordingly, the conductive films 418, 419, 420, 430, 431, and 432 in FIGS. 12B and 12C correspond to the conductive films 201, 209, 207, 216, 208, and 205, respectively.

Note that FIGS. 12A to 12C and FIGS. 13A and 13B illustrate only two protective diodes, and FIG. 10 illustrates the example in which five protective diodes are connected in series. The number of protective diodes is not limited to those in FIGS. 12A to 12C and FIGS. 13A and 13B.

In practice, a plurality of photo ICs are formed over a large substrate. Accordingly, after the above steps are completed, the substrate is divided by a dicing method, a laser cut method, or the like so that the photo ICs are separated from each other.

Before the substrate 400 is divided, the substrate 400 may be thinned by being polished or ground from the side of a surface (the back surface) which is opposite to the surface where the semiconductor elements are formed by a glass polisher, a glass grinder, or the like. By thinning the substrate 400 in advance, wear of a cutter used for dividing the substrate 400 can be reduced. Moreover, by thinning the substrate 400, the thickness of the photo IC can be reduced. Note that the substrate 400 may be thinned by chemical mechanical polishing. The step of thinning the substrate 400 can be performed, for example, after the conductive films 435 and 436 are formed and before the conductive films 440 and 441 are formed.

In addition, a color layer functioning as a color filter may be formed on the back surface of the substrate 400. There is no particular limitation on the color layer as long as a layer can preferentially transmit visible light in a specific wavelength region. For example, a resin in which pigment is dispersed can be used.

Figure 15A:
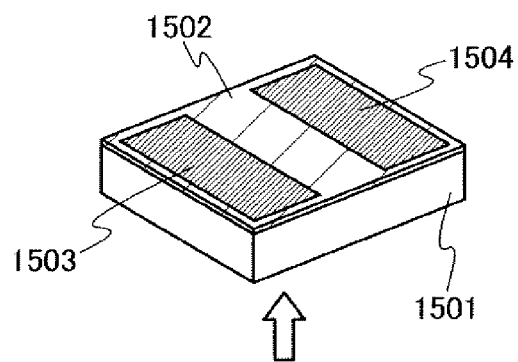
FIGS. 15A and 15B each are a perspective view illustrating the appearance of a photo IC.

As an example, FIG. 15A illustrates a perspective view showing the appearance of a photo IC after the division. In the photo IC illustrated in FIG. 15A, over a substrate 1501 after the division, an element layer 1502 including a light-receiving element, a protective diode, and an integrated circuit; and a first terminal 1503 and a second terminal 1504 which are electrically connected to the element layer are formed. Since the substrate 1501 has a light-transmitting property, light from the back surface side of the substrate 1501 as indicated by the arrow can be received by the light-receiving element in the element layer 1502.

Figure 15B:
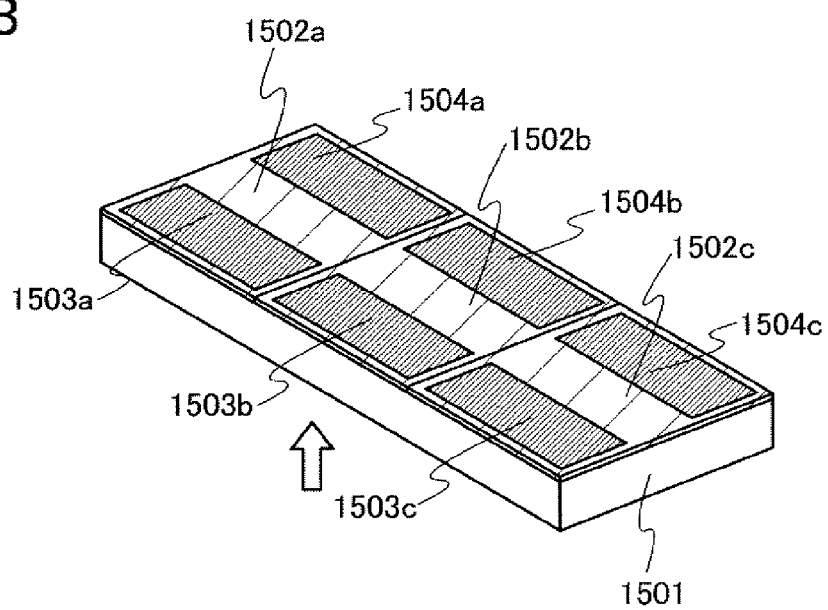

Note that FIG. 15A illustrates the case where the substrate is cut so that the photo ICs are separated into individual photo ICs. Alternatively, the substrate may be cut so that a plurality of photo ICs are arranged on one piece of the substrate. As an example, FIG. 15B illustrates a perspective view showing the appearance of three photo ICs arranged on one piece of the substrate. In the photo IC illustrated in FIG. 15B, over the substrate 1501 after the division, element layers 1502a, 1502b, and 1502c each of which includes a light-receiving element, a protective diode, and an integrated circuit; a first terminal 1503a and a second terminal 1504a which are electrically connected to the element layer 1502a; a first terminal 1503b and a second terminal 1504b which are electrically connected to the element layer 1502b; and a first terminal 1503c and a second terminal 1504c which are electrically connected to the element layer 1502c are formed. Since the substrate 1501 has a light-transmitting property, light from the back surface side of the substrate 1501 as indicated by the arrow can be received by the light-receiving elements in the element layers 1502a, 1502b, and 1502c.

Further, a photo IC may be formed by transferring a semiconductor element formed by the above method to a flexible substrate such as plastic. The transfer can be performed by a variety of methods such as a method in which a metal oxide film is provided between a substrate and a semiconductor element and weakened by crystallization so that the semiconductor element is separated and transferred; a method in which an amorphous silicon film containing hydrogen is provided between a substrate and a semiconductor element and removed by laser light irradiation or etching so that the semiconductor element is separated from the substrate and transferred; and a method in which a substrate where a semiconductor element is formed is mechanically eliminated or removed by etching with a solution or a gas so that the semiconductor element is separated from the substrate and transferred. Note that the transfer is preferably performed before a light-receiving element is formed.

In the photo IC of the present invention, all of circuits which are necessary to realize a predetermined function may be formed over one substrate, or may be formed over different substrates depending on functions and electrically connected to each other by mounting. Since a thin film transistor is used in the photo IC in this embodiment mode, the photo IC can be formed over a light-transmitting substrate such as a glass substrate. Accordingly, even when a photodiode is formed over a transistor, the photodiode can receive light entering from the back side of the light-transmitting substrate.

This embodiment mode can be implemented in combination with other embodiment modes and embodiments as appropriate.

Embodiment Mode 7

A photo IC of the present invention may be a digital output type photo IC which outputs information including the intensity of light sensed by a photodiode as a digital signal, or an analog output type photo IC which outputs such information as an analog signal. In this embodiment mode, an example of a structure of a digital output type photo IC in the present invention will be described.

Figure 14:
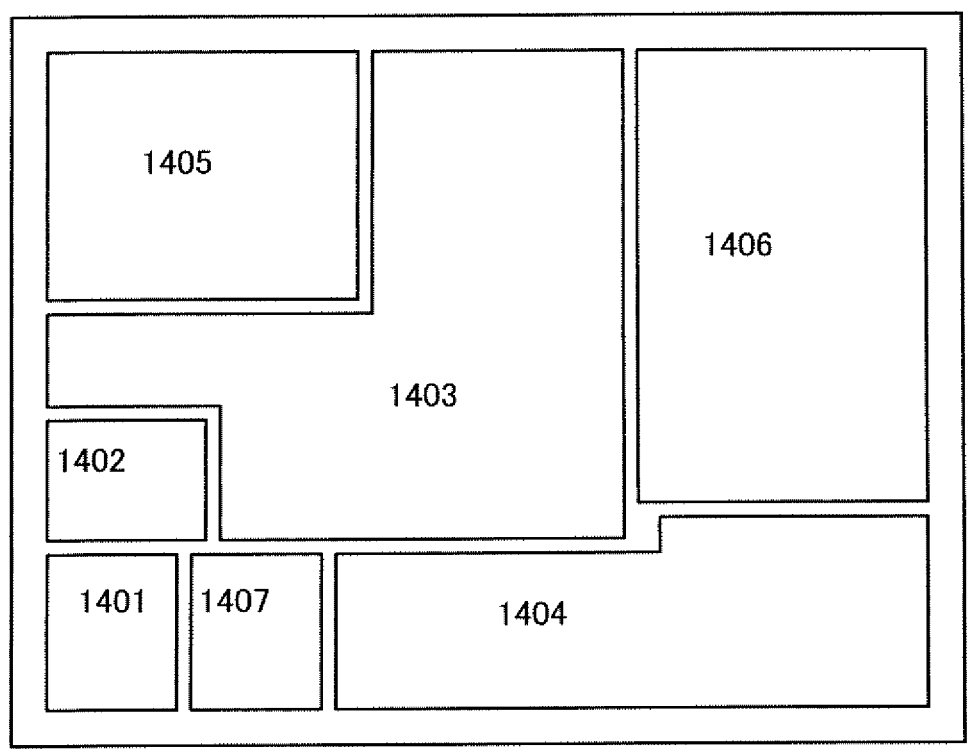
FIG. 14 is a block diagram illustrating a structure of a photo IC.

As an example, FIG. 14 is a block diagram of a photo IC in this embodiment mode. The photo IC illustrated in FIG. 14 includes a light-receiving element 1401, an amplifier circuit 1402, an AD converter (analog-digital converter) 1403, a regulator 1404, an oscillator 1405, an interface 1406, and a protective diode 1407.

When the light-receiving element 1401 is irradiated with light, current which is commensurate with the intensity of the light is generated in the light-receiving element 1401. The amplifier circuit 1402 amplifies the current generated in the light-receiving element 1401. In the AD converter 1403, the current amplified in the amplifier circuit 1402 is converted from the analog value into the digital value to generate a digital signal including the value of the current as information.

The interface 1406 controls input to the oscillator 1405 of a clock signal which is supplied from outside the photo IC and serves as a reference. Moreover, the interface 1406 controls input to the regulator 1404 of power supply voltage applied from outside the photo IC. When a command to obtain information including the intensity of light is given to the photo IC from a CPU or the like, for example, the interface 1406 processes the digital signal output from the AD converter 1403 so as to convert the digital signal into a digital signal which meets a predetermined standard and output the resulting signal.

The oscillator 1405 generates a clock signal for controlling operation of the AD converter 1403 by using the clock signal which is input through the interface 1406 and serves as the reference. Further, the regulator 1404 stabilizes the power supply voltage input through the interface 1406 or adjusts the level of the power supply voltage, and then applies the resulting power supply voltage to the amplifier circuit 1402, the AD converter 1403, and the oscillator 1405.

In the present invention, a vertical-junction type photodiode, preferably vertical-junction type photodiode, is used as the light-receiving element 1401 and the protective diode 1407. A vertical-junction type diode can have a larger junction surface than a diode formed using a transistor. Accordingly, the vertical-junction type diode can prevent electric field concentration by spreading charges which flow into the diode by surge current over the entire junction surface, whereby the vertical-junction type diode is highly resistant to pressure and less likely to be deteriorated or damaged by dielectric breakdown than the transistor. Moreover, the thickness of semiconductor films in the vertical-junction type diode can be thicker than a semiconductor film and a gate insulating film included in the transistor. Therefore, by using the vertical-junction type diode as the protective diode 1407, the light-receiving element 1401 and an integrated circuit including the amplifier circuit 1402, the AD converter 1403, the regulator 1404, the oscillator 1405, and the interface 1406 can be prevented from being deteriorated or damaged by dielectric breakdown due to surge current. In addition, by using a vertical-junction type diode also as the light-receiving element 1401, increase in the number of steps for manufacturing the photo IC can be prevented even when the protective diode 1407 is additionally provided.

This embodiment mode can be implemented in combination with other embodiment modes and embodiments as appropriate.

Embodiment 1

In this embodiment, a method for manufacturing a photo IC of the present invention, in which a semiconductor element is formed using a semiconductor film that is transferred from a semiconductor substrate (a bond substrate) to a supporting substrate (a base substrate), will be described.

Figure 16A:
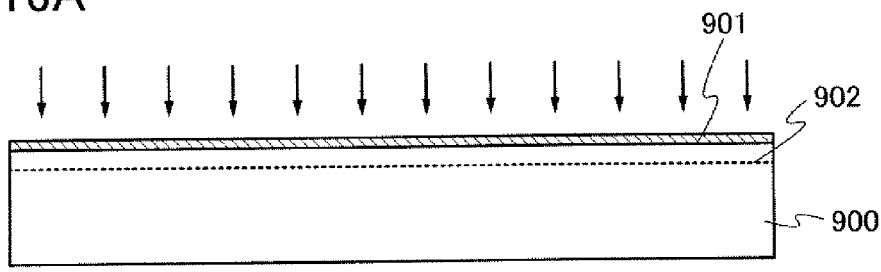
FIGS. 16A to 16D illustrate a method for manufacturing a photo IC.

First, as illustrated in FIG. 16A, an insulating film 901 is formed over a bond substrate 900. The insulating film 901 is formed using an insulating material such as silicon oxide, silicon nitride oxide, or silicon nitride. The insulating film 901 may be a single insulating film or a stack of a plurality of insulating films. For example, in this embodiment, for the insulating film 901, silicon oxynitride containing a larger amount of oxygen than nitrogen, and silicon nitride oxide containing a larger amount of nitrogen than oxygen are sequentially stacked from the bond substrate 900 side.

For example, when silicon oxide is used for the insulating film 901, the insulating film 901 can be formed using a mixed gas of silane and oxygen, a mixed gas of TEOS (tetraethoxysilane) and oxygen, or the like by a vapor deposition method such as thermal CVD, plasma CVD atmospheric pressure CVD, or bias ECRCVD. In that case, a surface of the insulating film 901 may be densified with oxygen plasma treatment. When silicon nitride is used for the insulating film 901, the insulating film 901 can be formed using a mixed gas of silane and ammonium by a vapor deposition method such as plasma CVD. Further, when silicon nitride oxide is used for the insulating film 901, the insulating film 901 can be formed using a mixed gas of silane and ammonium or a mixed gas of silane and nitrogen oxide by a vapor deposition method such as plasma CVD.

Alternatively, the insulating film 901 may be formed of silicon oxide which is formed using an organosilane gas by a chemical vapor deposition method. As the organosilane gas, a silicon-containing compound such as tetraethoxysilane (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), trietboxysilane ($SiH(OC_2H_5)_3$), or trisdimethylaminosilane ($SiH(CH_3)_2)_3$) can be used.

Next, as illustrated in FIG. 16A, hydrogen or a rare gas, or hydrogen ions or rare gas ions is/are introduced into the bond substrate 900 as indicated by arrows, whereby a defect layer 902 having microvoids is formed in a region at a predetermined depth from a surface of the bond substrate 900. The position where the defect layer 902 is formed is determined depending on acceleration voltage at the time of the introduction. The thickness of a semiconductor film 908 which is transferred from the bond substrate 900 to a base substrate 904 is determined by the position of the defect layer 902; therefore, acceleration of the voltage at the time of the introduction is performed in consideration of the thickness of the semiconductor film 908. The semiconductor film 908 is formed to a thickness of 10 nm to 200 nm, preferably 10 nm to 50 nm. For example, when hydrogen is introduced into the bond substrate 900, the dose is preferably $3 \times 10^{16}/cm^2$ to $1 \times 10^{17}/cm^2$.

Note that, in the step of forming the defect layer 902, hydrogen or a rare gas, or hydrogen ions or rare gas ions is/are introduced into the bond substrate 900 at a high concentration; accordingly, the surface of the bond substrate 900 becomes rough and bonding strength between the base substrate 904 and the bond substrate 900 is not sufficient in some cases. By providing the insulating film 901, the surface of the bond substrate 900 is protected when hydrogen or a rare gas, or hydrogen ions or rare gas ions is/are introduced, and the base substrate 904 and the bond substrate 900 can be bonded to each other well.

Figure 16B:
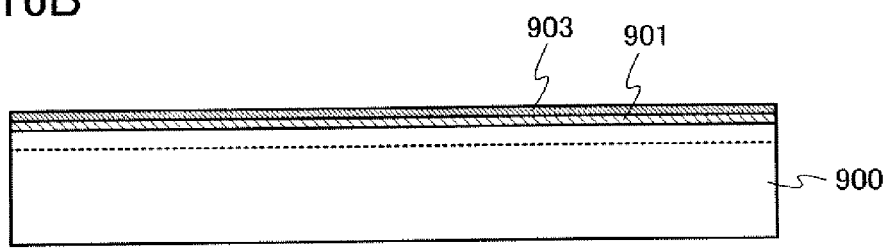

Next, as illustrated in FIG. 16B, an insulating film 903 is formed over the insulating film 901. Like the insulating film 901, the insulating film 903 is formed using an insulating material such as silicon oxide, silicon nitride oxide, or silicon nitride. The insulating film 903 may be a single insulating film or a stack of a plurality of insulating films. Alternatively, the insulating film 903 may be formed of silicon oxide which is formed using an organosilane gas by a chemical vapor deposition method. In this embodiment, silicon oxide which is formed using an organosilane gas by a chemical vapor deposition method is used for the insulating film 903.

Note that when an insulating film with a high barrier property, such as silicon nitride or silicon nitride oxide, is used as the insulating film 901 or the insulating film 903, impurities such as alkali metal or alkaline earth metal can be prevented from entering from the base substrate 904 into a semiconductor film 909 which is formed later.

In this embodiment the insulating film 903 is formed after the defect layer 902 is formed; however, the insulating film 903 is not always necessary. Note that since the insulating film 903 is formed after the defect layer 902 is formed, the surface of the insulating film 903 has higher planarity than the insulating film 901 which is formed before the defect layer 902 is formed. Therefore, by forming the insulating film 903, bonding to be performed later can be further strengthened.

Next, before the bond substrate 900 and the base substrate 904 are bonded to each other, hydrogenation may be performed on the bond substrate 900. The hydrogenation is performed, for example, at 350° C. in a hydrogen atmosphere for approximately 2 hours.

Figure 16C:
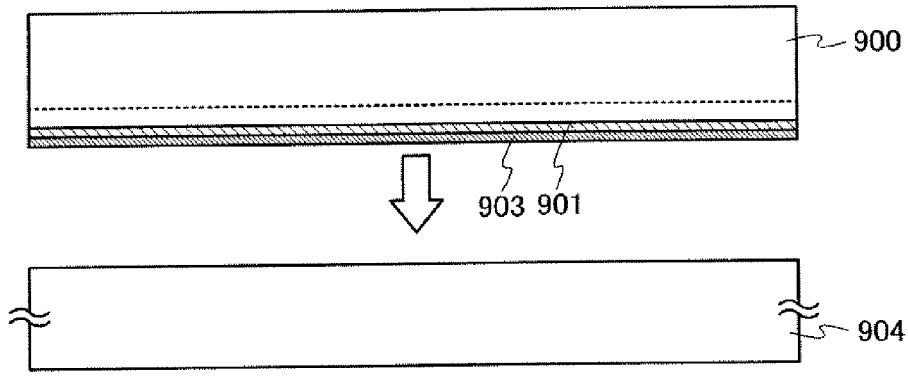
Figure 16D:
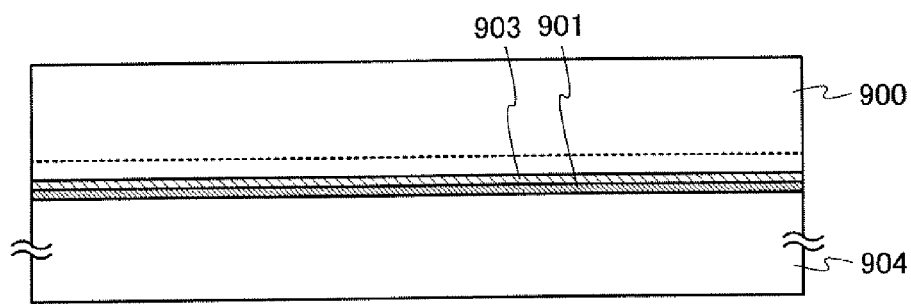

Then, as illustrated in FIG. 16C, the bond substrate 900 and the base substrate 904 overlap each other so that the insulating film 903 is interposed therebetween, and are bonded to each other as illustrated in FIG. 16D. The insulating film 903 and the base substrate 904 are bonded to each other, whereby the bond substrate 900 and the base substrate 904 can be bonded to each other.

The bonding is performed by Van der Waals force, so that the bonding is firm even at room temperature. Note that since the above bonding can be performed at low temperature, a variety of substrates can be used for the base substrate 904. As the base substrate 904, for example, a substrate such as a quart substrate or a sapphire substrate can be used as well as a glass substrate made of aluminosilicate glass, barium borosilicate glass, aluminoborosilicate glass. Moreover, as the base substrate 904, a semiconductor substrate made of silicon, gallium arsenide, indium phosphide, or the like can be used.

Note that an insulating film may also be formed on the surface of the base substrate 904 so that the insulating film and the insulating film 903 are bonded to each other. In that case, as the base substrate 904, a metal substrate such as a stainless-steel substrate can be used as well as the substrates described above. A substrate formed of a flexible synthetic resin such as plastic generally tends to have a lower allowable temperature limit than that of the above substrates; however, the substrate can be used as the base substrate 904 as long as it can resist processing temperature in a manufacturing process. Examples of a plastic substrate are polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, and acrylic resin.

As the bond substrate 900, a single crystal semiconductor substrate of silicon, germanium, or the like or a polycrystalline semiconductor substrate of silicon, germanium, or the like can be used. Alternatively, a single crystal semiconductor substrate or a polycrystalline semiconductor substrate formed of a compound semiconductor such as gallium arsenide or indium phosphide can be used as the bond substrate 900. Further alternatively, as the bond substrate 900, a semiconductor substrate formed of silicon having lattice distortion, silicon germanium in which germanium is added to silicon, or the like may be used. Silicon having lattice distortion can be formed by formation of silicon on silicon germanium or silicon nitride which has a larger lattice constant than silicon.

Note that thermal treatment or pressure treatment may be performed after the base substrate 904 and the bond substrate 900 are bonded to each other. The bonding strength can be increased with heat treatment or pressure treatment.

Figure 17A:
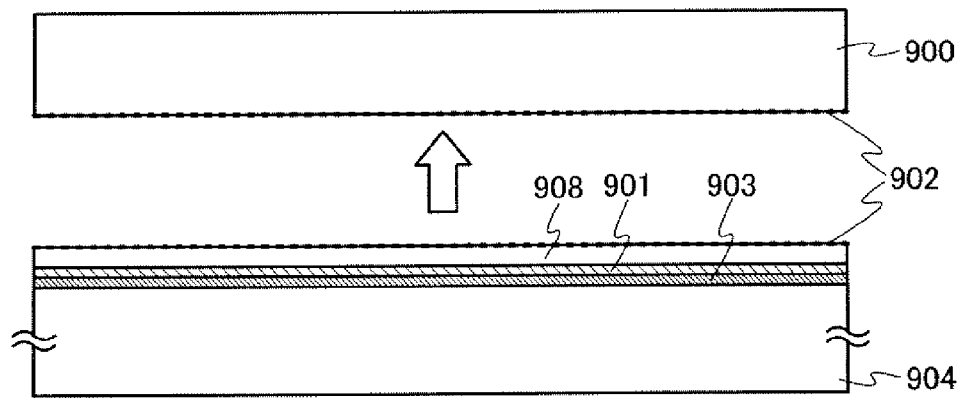
FIGS. 17A to 17C illustrate a method for manufacturing a photo IC.

By performing the thermal treatment after the above bonding, adjacent microvoids in the defect layer 902 are coupled and the volume of the microvoids is increased. Thus, as illustrated in FIG. 17A, the bond substrate 900 is split along the defect layer 902, so that the semiconductor film 908 which has been part of the bond substrate 900 is separated from the bond substrate 900. The thermal treatment is preferably performed at a temperature that is equal to or lower than the allowable temperature limit of the base substrate 904. For example, the thermal treatment may be performed at temperatures ranging from 400° C. to 600° C. By the separation, the semiconductor film 908 together with the insulating films 901 and 903 are transferred to the base substrate 904. After that, thermal treatment at temperatures ranging from 400° C. to 600° C. is preferably performed in order to further strengthen the bonding between the insulating film 903 and the base substrate 904.

The crystal orientation of the semiconductor film 908 can be controlled with the plane orientation of the bond substrate 900. The bond substrate 900 having crystal orientation which is suitable for a semiconductor element to be formed may be used as appropriate. Mobility of the transistor differs depending on the crystal orientation of the semiconductor film 908. When a transistor with higher mobility is desired to be obtained, the direction of bonding of the bond substrate 900 is set in consideration of the direction of a channel and the crystal orientation.

Next, the surface of the transferred semiconductor film 908 is planarized. Although the planarization is not always necessary, the planarization makes it possible to improve characteristics of the interface between the semiconductor film 908 and a gate insulating film in the transistor to be formed later. Specifically, the planarization can be performed by chemical mechanical polishing (CMP). The thickness of the semiconductor film 908 is reduced by the above planarization.

Note that in this embodiment, the case of using Smart Cut (registered trademark) in which the semiconductor film 908 is separated from the bond substrate 900 by the defect layer 902 is described. Alternatively, the semiconductor film 908 may be bonded to the base substrate 904 by another bonding method such as ELTRAN (epitaxial layer transfer), a dielectric isolation method, or a PACE (plasma assisted chemical etching) method.

Figure 17B:
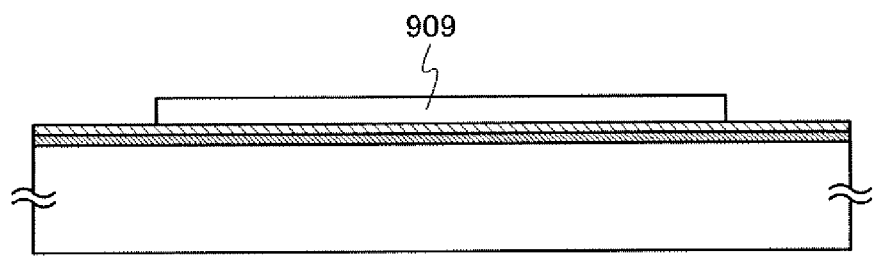

Next, as illustrated in FIG. 17B, the semiconductor film 908 is processed (patterned) into a desired shape, so that the island-shaped semiconductor film 909 is formed.

Figure 17C:
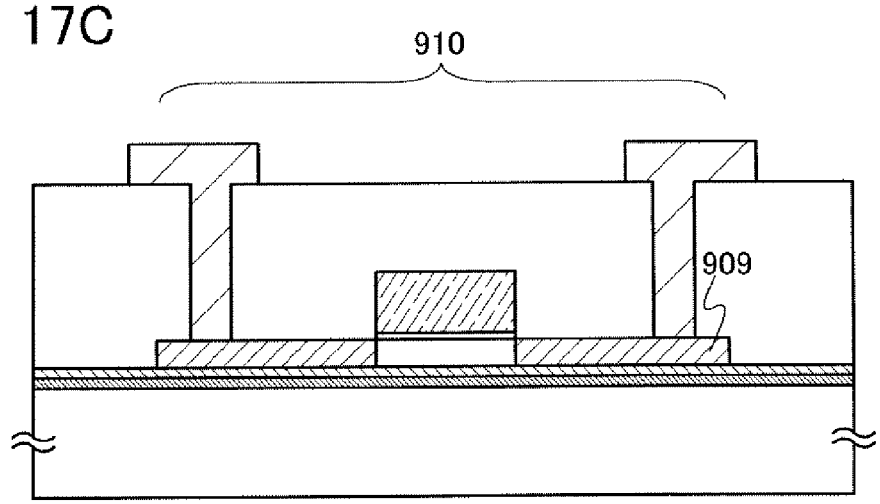

By using the semiconductor film 909 formed through the above steps, a variety of semiconductor elements such as transistors can be formed. FIG. 17C illustrates a transistor 910 formed using the semiconductor film 909.

With the above manufacturing method, a semiconductor element included in the photo IC of the present invention can be formed.

This embodiment can be implemented in combination with other embodiment modes and embodiments as appropriate.

Embodiment 2

Figure 18A:
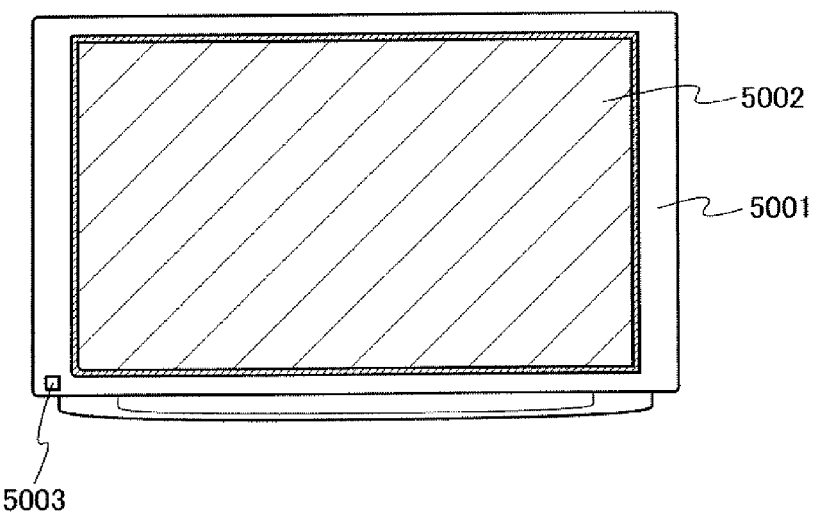
FIGS. 18A and 18B each illustrate an electronic device including a photo IC.
Figure 18B:
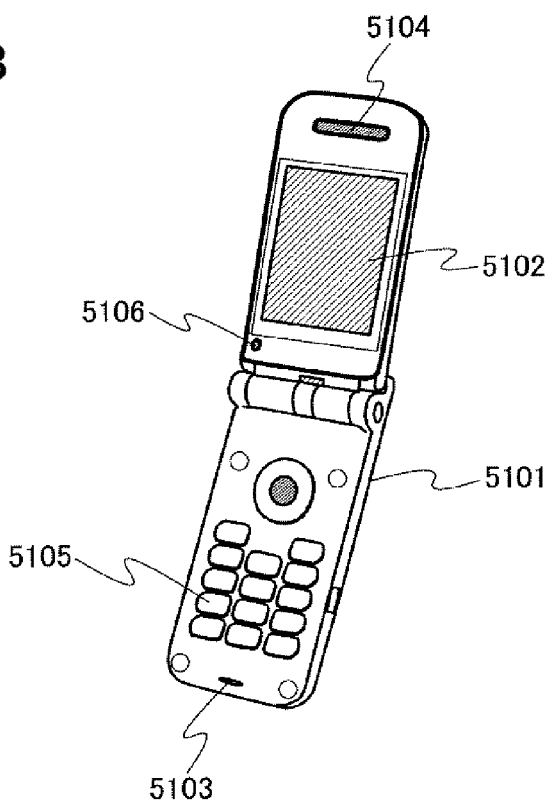

A photo IC of the present invention is inexpensive and has high reliability because reduction in current output from the photo IC can be suppressed and the occurrence of ESD in the photo IC can be prevented without greatly increasing the number of steps for manufacturing the photo IC. Therefore, by using the photo IC of the present invention, increase in manufacturing cost of an electronic device, which is caused by adding a photo IC as its component, can be suppressed. Moreover, when an electronic device additionally includes the photo IC of the present invention as its component, reduction in reliability can be suppressed. The photo IC of the present invention can be used in a display device, a laptop computer, or an image reproducing device provided with a recording medium (typically a device which reproduces a recording medium such as a digital versatile disc (DVD) and has a display capable of displaying the image). Further, as electronic devices which can include the photo IC of the present invention, cellular phones, portable game machines, e-book readers, video cameras, digital still cameras, goggle displays (head-mounted displays), navigation systems, audio reproducing devices (e.g., car audio components and audio components), and the like can be given. FIGS. 18A and 18B illustrate specific examples of such electronic devices.

FIG. 18A illustrates a display device including a housing 5001, a display portion 5002, a sensor portion 5003, and the like. A photo IC of the present invention is used for the sensor portion 5003. The sensor portion 5003 detects the intensity of external light. In the display device, the luminance of the display portion 5002 can be controlled in accordance with the intensity of detected external light. By controlling the luminance of the display portion 5002 in accordance with the intensity of the external light, power consumption of the display device can be reduced. Note that the display device refers to any device for displaying information, for example, for a personal computer, for receiving TV broadcasting, and for displaying an advertisement.

FIG. 18B illustrates a cellular phone including a main body 5101, a display portion 5102, an audio input portion 5103, an audio output portion 5104, operation keys 5105, a sensor portion 5106, and the like. The sensor portion 5106 detects the intensity of external light. In the cellular phones the luminance of the display portion 5102 or the operation keys 5105 can be controlled in accordance with the intensity of detected external light. By controlling the luminance of the display portion 5002 or the operation keys 5105 in accordance with the intensity of the external lights power consumption of the cellular phone can be reduced.

This embodiment can be implemented in combination with other embodiment modes and embodiments as appropriate.

This application is based on Japanese Patent Application Serial No. 2008-072811 filed with Japan Patent Office on Mar. 21, 2008, the entire contents of which are hereby incorporated by reference.

What is claimed is:

1. A semiconductor device comprising:
   a photodiode configured to generate a first current by irradiation with a light;
   a circuit configured to generate a second current by supply of the first current;
   a first diode directly connected with the photodiode so that a bias direction of the first diode is the same as that of the photodiode;
   a second diode directly connected with the photodiode so that a bias direction of the second diode is the opposite to that of the photodiode; and
   a conductive film over the first diode,
   wherein a first terminal of the first diode is directly connected with a first terminal of the photodiode,
   wherein a first terminal of the second diode is directly connected with the first terminal of the photodiode,
   wherein a second terminal of the photodiode is directly connected with a first terminal of the circuit,
   wherein a second terminal of the first diode is directly connected with a second terminal of the circuit,
   wherein a second terminal of the second diode is directly connected with a third terminal of the circuit, and
   wherein the circuit comprises a first transistor and a second transistor, and a gate of the first transistor, a gate of the second transistor and the second terminal of the photodiode are directly connected to each other.

2. A semiconductor device according to claim 1, wherein the first diode is a photodiode.

3. A semiconductor device according to claim 1, wherein each of the photodiode and the first diode includes a stack of a plurality of semiconductor films.

4. A semiconductor device according to claim 1, wherein the conductive film shields light.

5. A semiconductor device comprising:
   a photodiode configured to generate a first current by irradiation with a light;
   an amplifier circuit including at least one transistor, the amplifier circuit configured to generate a second current by amplifying the first current;
   a first diode directly connected with the photodiode so that a bias direction of the first diode is the same as that of the photodiode;
   a second diode directly connected with the photodiode so that a bias direction of the second diode is the opposite to that of the photodiode; and
   a conductive film over the first diode, wherein a first terminal of the first diode is directly connected with a first terminal of the photodiode,
wherein a first terminal of the second diode is directly connected with the first terminal of the photodiode,
wherein a second terminal of the photodiode is directly connected with a first terminal of the amplifier circuit,
wherein a second terminal of the first diode is connected with a second terminal of the amplifier circuit,
wherein a second terminal of the second diode is connected with a third terminal of the amplifier circuit, and
wherein the amplifier circuit comprises a first transistor and a second transistor, and a gate of the first transistor, a gate of the second transistor and the second terminal of the photodiode are directly connected to each other.

6. A semiconductor device according to claim 5, wherein the first diode is a photodiode.

7. A semiconductor device according to claim 5, wherein each of the photodiode and the first diode includes a stack of a plurality of semiconductor films.

8. A semiconductor device according to claim 5, wherein the conductive film shields light.

* * * * *

UNITED STATES PATENT AND TRADEMARK OFFICE
CERTIFICATE OF CORRECTION

PATENT NO. : 8,779,348 B2
APPLICATION NO. : 12/407108
DATED : July 15, 2014
INVENTOR(S) : Yoshifumi Tanada et al.

It is certified that error appears in the above-identified patent and that said Letters Patent is hereby corrected as shown below:

In the Specification:

Col. 2, line 17, "transistor Accordingly," should read --transistor. Accordingly--

Col. 2, line 23, "transistor Moreover" should read --transistor. Moreover--

Col. 4, line 41, "light receiving, element" should read --light-receiving element--

Col. 6, line 64, "vertical-unction" should read --vertical-junction--

Col. 7, line 4, "seminconductor" should read --semiconductor--

Col. 7, line 14, "photodiode the integrated circuit" should read --photodiode, the integrated circuit--

Col. 15, line 22, "HIFS," should read --HFS--

Col. 15, line 67, "CaN" should read --GaN--

Col. 16, line 41, "SiH," should read --SiH$_4$--

Col. 19, line 22, "perfonned" should read --performed--

Col. 20, line 5, "lement" should read --element--

Col. 22, line 39, "(ZO)" should read --(IZO)--

Col. 23, line 33, "(secm);" should read --(sccm);--

Signed and Sealed this
Fourteenth Day of April, 2015

Michelle K. Lee
*Director of the United States Patent and Trademark Office*

CERTIFICATE OF CORRECTION (continued)
U.S. Pat. No. 8,779,348 B2

In the Specification (cont.):

Col. 23, line 44, "(secm);" should read --(sccm);--

Col. 24, line 28, "tow" should read --low--

Col. 32, line 45, "plasma CVD atmospheric plasma CVD" should read --plasma CVD, atmospheric plasma CVD--

Col. 32, line 62, "trietboxysilane" should read --triethoxysilane--

Col. 32, line 64, "$(SiH(CH_3)_2)_3)$" should read --$(SiH(N(CH_3)_2)_3)$--

Col. 33, line 67, "quart" should read --quartz--